United States Patent
Nagano et al.

(10) Patent No.: US 7,132,709 B2
(45) Date of Patent: Nov. 7, 2006

(54) SEMICONDUCTOR DEVICE INCLUDING A CAPACITOR HAVING A CAPACITIVE INSULATING FILM OF AN INSULATING METAL OXIDE

(75) Inventors: Yoshihisa Nagano, Suita (JP); Toyoji Ito, Otsu (JP); Sadayuki Imanishi, Kameoka (JP); Eiji Fujii, Ibaraki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 334 days.

(21) Appl. No.: 10/149,389

(22) PCT Filed: Nov. 2, 2001

(86) PCT No.: PCT/JP01/09653

§ 371 (c)(1),
(2), (4) Date: Jun. 12, 2002

(87) PCT Pub. No.: WO02/056382

PCT Pub. Date: Jul. 18, 2002

(65) Prior Publication Data

US 2003/0032230 A1 Feb. 13, 2003

(30) Foreign Application Priority Data

Jan. 15, 2001 (JP) ................................ 2001-5970

(51) Int. Cl.
*H01L 27/108* (2006.01)
*H01L 21/8242* (2006.01)

(52) U.S. Cl. ................. 257/306; 257/303; 257/310; 257/296; 438/253; 438/396; 438/E21.008

(58) Field of Classification Search ................ None
See application file for complete search history.

(56) References Cited

U.S. PATENT DOCUMENTS

| 5,523,595 | A | * | 6/1996 | Takenaka et al. ........... 257/295 |
| 5,960,252 | A | | 9/1999 | Matsuki et al. |
| 6,188,098 | B1 | | 2/2001 | Amanuma |

(Continued)

FOREIGN PATENT DOCUMENTS

EP 514547 A1 11/1992

(Continued)

OTHER PUBLICATIONS

Tetsuro Tamura et al., "Kyo-Yudentai Capacitor No Process Rekka", Denshi Joho Tsushin Gakkai Ronbunshi C, Jan. 2000, vol. J83-C, No. 1, pp. 53-59.

*Primary Examiner*—Dung A. Le
(74) *Attorney, Agent, or Firm*—McDermott Will & Emery LLP

(57) ABSTRACT

A capacitor 11 made up of a lower electrode 8, a capacitive insulating film 9 of an insulating metal oxide and an upper electrode 10 is formed over a semiconductor substrate 1. A first-layer wire 14 is formed on a passivation film 12 that covers the capacitor 11. A first interlevel dielectric film 15 is deposited to cover the first-layer wire 14. A second interlevel dielectric film 17 is deposited over the first interlevel dielectric film 15 with a barrier film 16, which overlaps the capacitor 11 for preventing hydrogen from diffusing, interposed therebetween. A second-layer wire 19 is formed on the second interlevel dielectric film 17. The first interlevel dielectric film 15 has a hydrogen content lower than that of the second interlevel dielectric film 17.

19 Claims, 11 Drawing Sheets

U.S. PATENT DOCUMENTS 6,271,146 B1 * 8/2001 Ross .......................... 438/723
6,344,413 B1 * 2/2002 Zurcher et al. ............. 438/678
6,395,612 B1    5/2002 Amanuma
6,509,601 B1 * 1/2003 Lee et al. ................... 257/310

FOREIGN PATENT DOCUMENTS

| | | |
|---|---|---|
| JP | 10-321811 | 12/1998 |
| JP | 10-326865 A | 12/1998 |
| JP | 11-111930 A | 4/1999 |
| JP | 11-135736 A | 5/1999 |
| JP | 2000-294743 A | 10/2000 |
| KR | 0275984 B1 | 10/1998 |

* cited by examiner

SEMICONDUCTOR DEVICE INCLUDING A CAPACITOR HAVING A CAPACITIVE INSULATING FILM OF AN INSULATING METAL OXIDE

TECHNICAL FIELD

The present invention relates to a semiconductor device including a capacitor made up of lower electrode, capacitive insulating film of an insulating metal oxide, and upper electrode.

BACKGROUND ART

Recently, as digital technology has been developed, the performance of various electronic units has been further enhanced to catch up with a steep rise in the amount of data to be processed or stored at a time. As a result, semiconductor devices used for those electronic units and semiconductor elements mounted on the semiconductor devices have been rapidly downsized. Correspondingly, to integrate a dynamic RAM (Random Access Memory) more densely, a technique of using a material with a high dielectric constant (which will be herein referred to as a "high-κ material"), instead of silicon oxide or silicon nitride widely used, for a capacitive insulating film of a capacitor has been broadly researched and developed. Further, to implement a novel nonvolatile RAM that can operate at a low operating voltage and write and read data at a high speed, a ferroelectric film with spontaneous polarization properties has been vigorously researched and developed. It is noted that each of the high-κ material and the ferroelectric is an insulating metal oxide.

The most essential task in fabricating a semiconductor memory device such as a nonvolatile RAM is to develop a fabrication process for integrating a capacitor in a CMOS (Complementary Metal Oxide Semiconductor) integrated circuit without deteriorating characteristics of the capacitor. In developing such a fabrication process, it is the most difficult task to suppress reduction of a capacitive insulating film caused by hydrogen or moisture generated during the fabrication process, i.e., to suppress deterioration of capacitor characteristics resulting from reduction of a high-κ material or a ferroelectric.

If capacitor characteristics are deteriorated due to reduction of a capacitive insulating film before an interconnect layer is formed, the capacitive insulating film is re-oxidized during an annealing process performed at high temperatures of 650° C. or higher in an oxygen ambient (which will be hereinafter referred to as a "high-temperature oxygen annealing"), thereby recovering the capacitor characteristics. On the other hand, after the interconnect layer has been formed, the annealing temperature is limited up to about 450° C. because there is a limit on the heat resistance of materials used for interconnection such as aluminum. Thus, an oxidation process with the high-temperature oxygen annealing cannot be used. Accordingly, to suppress the deterioration in capacitor characteristics by preventing reduction of the capacitive insulating film caused by hydrogen or moisture generated after the formation of the interconnect layer, it is necessary to prevent the hydrogen or the moisture from reaching an insulating metal oxide that constitutes the capacitive insulating film.

Hereinafter, a conventional semiconductor device, specifically the semiconductor device disclosed in Japanese Laid-Open Publication No. 10-321811 will be described with reference to the drawings.

FIG. 10 is a cross-sectional view of a conventional semiconductor device.

As shown in FIG. 10, a gate electrode 104 is formed over a region surrounded by an isolating insulating film 102 (which will be hereinafter referred to as a "transistor region") in a semiconductor substrate 101 with a gate insulating film 103 interposed therebetween. A sidewall 105 is formed on side faces of the gate electrode 104. A doped layer 106 to be source/drain regions is defined in the transistor region of the semiconductor substrate 101.

A first passivation film 107 is deposited to cover the entire surface of the semiconductor substrate 101 where transistors, each including the gate electrode 104, the doped layer 106, and so on, are integrated. On the first passivation film 107, a capacitor 111 made up of lower electrode 108, capacitive insulating film 109 of Pb $(Zr_{1-x}Ti_x)O_3$ (where $0 \leq x \leq 1$) and upper electrode 110 is formed. A second passivation film 112 is deposited over the first passivation film 107 to cover the capacitor 111. A first contact hole 113A is formed in the second passivation film 112 to reach the upper electrode 110. A second contact hole 113B is formed in the first and second passivation films 107 and 112 to reach the doped layer 106. An interconnect layer 114 is deposited on the second passivation film 112 including the first and second contact holes 113A and 113B. Specifically, parts of the interconnect layer 114 are buried in the first and second contact holes 113A and 113B, thereby electrically connecting the capacitor 111 and the transistor (specifically, the doped layer 106 to be source/drain regions). A third passivation film 115 is deposited on the second passivation film 112 to cover the interconnect layer 114.

A plurality of third contact holes 116 are formed in the first, second and third passivation films 107, 112 and 115 to reach the doped layer 106. A first-layer wire 117 is formed on the third passivation film 115 including the third contact holes 116. Specifically, each of the third contact holes 116 is filled with part of the first-layer wire 117, thereby electrically connecting the first-layer wire 117 and the transistor.

A first interlevel dielectric film 118 is deposited over the entire semiconductor substrate 101 including the first-layer wire 117. The first interlevel dielectric film 118 is, for example, a silicon oxide film deposited by a plasma-enhanced CVD (Chemical Vapor Deposition) process or an SOG (spin-on-grass) film formed by an SOG process. The surface of the first interlevel dielectric film 118 has been planarized. A hydrogen barrier layer 119 is formed over the first interlevel dielectric film 118 to prevent hydrogen or moisture from diffusing, and the entire surface of the hydrogen barrier layer 119 is covered with a second interlevel dielectric film 120. A via hole 121 is formed in the second interlevel dielectric film 120, the hydrogen barrier layer 119 and the first interlevel dielectric film 118 to reach a predetermined area of the first-layer wire 117. The via hole 121 is formed by etching the second interlevel dielectric film 120, the hydrogen barrier layer 119 and the first interlevel dielectric film 118 in that order. A second-layer wire 122 is formed on the second interlevel dielectric film 120 as well as in the via hole 121. In other words, the via hole 121 is filled with part of the second-layer wire 122, thereby electrically connecting the first-layer wire 117 and the second-layer wire 122.

In the conventional semiconductor device shown in FIG. 10, the second interlevel dielectric film 120 is deposited over the first interlevel dielectric film 118 on the first-layer wire 117, with the hydrogen barrier layer 119 interposed between the first and second interlevel dielectric films 118 and 120. Thus, it is possible to suppress the reduction of the capacitive insulating film 109 caused by hydrogen or moisture generated after the deposition of the second interlevel dielectric film 120.

However, the present inventors found that the conventional semiconductor device shown in FIG. 10 has the following two problems. A first problem is that the capacitive insulating film 109 is reduced by hydrogen generated during the deposition of the first interlevel dielectric film 118, resulting in deteriorating characteristics of the capacitor 111. A second problem is that moisture contained in the first interlevel dielectric film 118 is diffused with the passage of time to reach the capacitor 111 after the first interlevel dielectric film 118 has been deposited, resulting in deteriorating characteristics of the capacitor 111. Since the first-layer wire 117 is formed under the first interlevel dielectric film 118, it is impossible to recover characteristics of the capacitor 111 through an oxidation process using the high-temperature oxygen annealing after the first interlevel dielectric film 118 has been deposited.

FIGS. 11(a) and 11(b) are views for use in describing the first and second problems.

If a silicon oxide film 118A deposited by a plasma-enhanced CVD process, for example, is used as the first interlevel dielectric film 118, silane or tetraethylortho silicate (TEOS) containing hydrogen, for example, is used for the silicon oxide film 118A. Thus, as shown in FIG. 11(a), hydrogen ions or hydrogen radicals that have been generated in large quantity in a plasma reach the capacitor 111. As a result, the high-κ material or ferroelectric used for the capacitive insulating film 109 is reduced, thus deteriorating characteristics of the capacitor 111.

In addition, if a silicon oxide film 118B formed by an SOG process or by reaction of ozone and TEOS, for example, is used as the first interlevel dielectric film 118, the silicon oxide film 118B contains a large amount of moisture, i.e., OH radicals, and these OH radicals reach the capacitor 111 one after another with the passage of time as shown in FIG. 11(b). As a result, the high-κ material or the ferroelectric used for the capacitive insulating film 109 is reduced, thus deteriorating characteristics of the capacitor 111. In addition to the OH radicals that reach the capacitor 111 due to the above-described change over time, other OH radicals also reach the capacitor 111 easily when a heat process is performed at temperatures of 400° C. or higher after the deposition of the first interlevel dielectric film 118, thus deteriorating characteristics of the capacitor 111.

That is to say, in the conventional semiconductor device, it is impossible to prevent the capacitor characteristics from deteriorating due to reduction of the capacitive insulating film made of an insulating metal oxide, and thus excellent characteristics cannot be obtained.

DISCLOSURE OF INVENTION

It is therefore an object of the present invention to prevent the capacitive insulating film made of an insulating metal oxide from being reduced when a high-temperature oxygen annealing cannot be used after the formation of an interconnect layer so as to improve capacitor characteristics.

To achieve this object, a first semiconductor device according to the present invention includes: a capacitor made up of a lower electrode, a capacitive insulating film of an insulating metal oxide and an upper electrode, the lower electrode, the capacitive insulating film and the upper electrode being stacked in that order over a semiconductor substrate; a passivation film formed over the semiconductor substrate to cover the capacitor; a first-layer wire formed on the passivation film; a first interlevel dielectric film formed on the passivation film to cover the first-layer wire; a barrier film formed on the first interlevel dielectric film to overlap at least part of the capacitor, for preventing hydrogen from diffusing; a second interlevel dielectric film formed over the first interlevel dielectric film and the barrier film; and a second-layer wire formed on the second interlevel dielectric film. In this device, the first interlevel dielectric film has a hydrogen content lower than that of the second interlevel dielectric film.

In the first semiconductor device, the first interlevel dielectric film having a low hydrogen content is deposited over the first-layer wire formed after the formation of the capacitor including the capacitive insulating film of the insulating metal oxide. Specifically, the first interlevel dielectric film contains a small amount of hydrogen (including hydrogen ions or hydrogen radicals generated during the deposition of the first interlevel dielectric film), thus suppressing reduction of the capacitive insulating film caused by the hydrogen. In addition, the second interlevel dielectric film is formed over the first interlevel dielectric film with the barrier film, which has been formed to overlap the capacitor and prevents hydrogen from diffusing, interposed therebetween. Thus, hydrogen contained in the second interlevel dielectric film (including hydrogen ions or hydrogen radicals generated during the deposition of the second interlevel dielectric film) is prevented from entering the capacitor and from reducing the capacitive insulating film. In a like manner, the capacitive insulating film is not reduced by hydrogen generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

In the first semiconductor device, the barrier film may prevent moisture from diffusing; and the first interlevel dielectric film may have a moisture content lower than that of the second interlevel dielectric film.

Then, the first interlevel dielectric film contains a small amount of moisture, i.e., OH radicals, so that reduction of the capacitive insulating film caused by the OH radicals is suppressed. In addition, the second interlevel dielectric film is formed over the first interlevel dielectric film with the barrier film, which has been formed to overlap the capacitor and prevents moisture from diffusing, interposed between the first and second interlevel dielectric films. Thus, moisture contained in the second interlevel dielectric film is prevented from entering the capacitor and from reducing the capacitive insulating film. Moreover, the capacitive insulating film is not reduced by moisture generated during a fabrication process after the second interlevel dielectric film has been formed. Accordingly, the reduction of the capacitive insulating film is prevented as intended, thus further ensuring improvement of capacitor characteristics.

In the first semiconductor device, the barrier film preferably includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

Then, hydrogen contained in the second interlevel dielectric film or hydrogen generated during a fabrication process after the formation of the second interlevel dielectric film does not enter the capacitor. As a result, it is ensured that deterioration of capacitor characteristics due to reduction of the capacitive insulating film is prevented.

In the first semiconductor device, the capacitive insulating film preferably includes at least one film selected from the group consisting of: a ferroelectric film having a bismuth-layered perovskite crystal structure; a Pb $(Zr_{1-x}Ti_x)O_3$ film (where $0 \leq x \leq 1$); a $(Ba_{1-y}Sr_y)TiO_3$ film (where $0 \leq y \leq 1$); a $Ta_2O_5$ film; an $Al_2O_3$ film; and an $La_2O_3$ film.

Then, it is possible to implement the capacitor using a reliable high-κ material or ferroelectric for its capacitive insulating film.

The first semiconductor device preferably includes a transistor formed on the semiconductor substrate and constituting a memory cell array with the capacitor. The barrier film is preferably formed to overlap the whole of a region where the memory cell array is provided.

Then, hydrogen, for example, contained in the second interlevel dielectric film does not enter the capacitor. Thus, it is ensured that deterioration of capacitor characteristics due to reduction of the capacitive insulating film is prevented.

In a case where the first semiconductor device includes the transistor, the capacitor may be provided over the semiconductor substrate including the transistor, with an insulating film interposed between the capacitor and the semiconductor substrate. In this case, the first-layer wire may electrically connect the capacitor and the transistor by way of first and second contact holes. The first contact hole may be formed in the passivation film to reach the upper electrode, and the second contact hole may be formed in the passivation film and the insulating film to reach the transistor. That is to say, the capacitor may have a planar structure.

In a case where the first semiconductor device includes the transistor, the capacitor may be provided over the semiconductor substrate including the transistor, with an insulating film interposed between the capacitor and the semiconductor substrate. In this case, the insulating film may be provided with a plug that connects the lower electrode and the transistor, thereby electrically connecting the capacitor and the transistor. That is to say, the capacitor may have a stacked structure.

In the first semiconductor device, the barrier film is preferably formed to overlap either one of the lower and upper electrodes.

Then, hydrogen, for example, contained in the second interlevel dielectric film does not enter the capacitor. As a result, it is ensured that deterioration of capacitor characteristics due to reduction of the capacitive insulating film is prevented.

The first semiconductor device preferably includes a via hole formed in respective regions of the first and second interlevel dielectric films where the barrier film is not formed so that the via hole reaches the first-layer wire. In this device, it is preferable that the second-layer wire is electrically connected to the first-layer wire by way of the via hole.

Then, even if the barrier film is made of a conductive material, it is possible to prevent the barrier film and a multilevel interconnection from being short-circuited.

A second semiconductor device according to the present invention includes a capacitor made up of a lower electrode, a capacitive insulating film of an insulating metal oxide and an upper electrode, the lower electrode, the capacitive insulating film and the upper electrode being stacked in that order over a semiconductor substrate; a passivation film formed over the semiconductor substrate to cover the capacitor; a first-layer wire formed on the passivation film; a first interlevel dielectric film formed on the passivation film to cover the first-layer wire; a barrier film formed on the first interlevel dielectric film to overlap at least part of the capacitor, for preventing moisture from diffusing; a second interlevel dielectric film formed over the first interlevel dielectric film and the barrier film; and a second-layer wire formed on the second interlevel dielectric film. In this device, the first interlevel dielectric film has a moisture content lower than that of the second interlevel dielectric film.

In the second semiconductor device, the first interlevel dielectric film having a low moisture content is deposited over the first-layer wire formed after the formation of the capacitor including the capacitive insulating film of an insulating metal oxide. Specifically, the first interlevel dielectric film contains a small amount of moisture, i.e., OH radicals, thus suppressing the OH radicals from reaching the capacitor one after another with the passage of time and from reducing the insulating metal oxide that constitutes the capacitive insulating film. That is to say, reduction of the capacitive insulating film caused by OH radicals is suppressed. In addition, the second interlevel dielectric film is formed over the first interlevel dielectric film with the barrier film, which has been formed to overlap the capacitor and prevents moisture from diffusing, interposed therebetween. Thus, moisture contained in the second interlevel dielectric film is prevented from entering the capacitor and from reducing the capacitive insulating film. In a like manner, the capacitive insulating film is not reduced by moisture generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

In the second semiconductor device, the barrier film preferably includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

Then, moisture contained in the second interlevel dielectric film or moisture generated during a fabrication process after the formation of the second interlevel dielectric film does not enter the capacitor. As a result, it is ensured that deterioration of capacitor characteristics due to reduction of the capacitive insulating film is prevented.

In the second semiconductor device, the capacitive insulating film preferably includes at least one film selected from the group consisting of: a ferroelectric film having a bismuth-layered perovskite crystal structure; a Pb $(Zr_{1-x}Ti_x)O_3$ film (where $0 \leq x \leq 1$); a $(Ba_{1-y}Sr_y)TiO_3$ film (where $0 \leq y \leq 1$); a $Ta_2O_5$ film; an $Al_2O_3$ film; and an $La_2O_3$ film.

Then, it is possible to implement the capacitor using a reliable high-κ material or ferroelectric for its capacitive insulating film.

The second semiconductor device preferably includes a transistor formed on the semiconductor substrate and constituting a memory cell array with the capacitor. The barrier film is preferably formed to overlap the whole of a region where the memory cell array is provided.

Then, moisture, for example, contained in the second interlevel dielectric film does not enter the capacitor. Thus, it is ensured that deterioration of capacitor characteristics due to reduction of the capacitive insulating film is prevented.

In a case where the second semiconductor device includes the transistor, the capacitor may be provided over the semiconductor substrate including the transistor, with an insulating film interposed between the capacitor and the semiconductor substrate. In this case, the first-layer wire may electrically connect the capacitor and the transistor by way of first and second contact holes. The first contact hole may be formed in the passivation film to reach the upper electrode, and the second contact hole may be formed in the passivation film and the insulating film to reach the transistor. That is to say, the capacitor may have a planar structure.

In a case where the second semiconductor device includes the transistor, the capacitor may be provided over the semiconductor substrate including the transistor, with an insulating film interposed between the capacitor and the semiconductor substrate. In this case, the insulating film may be provided with a plug that connects the lower electrode and the transistor, thereby electrically connecting the capacitor and the transistor. That is to say, the capacitor may have a stacked structure.

In the second semiconductor device, the barrier film is preferably formed to overlap either one of the lower and upper electrodes.

Then, moisture, for example, contained in the second interlevel dielectric film does not enter the capacitor. As a result, it is ensured that deterioration of capacitor characteristics due to reduction of the capacitive insulating film is prevented.

The second semiconductor device preferably includes a via hole formed in respective regions of the first and second interlevel dielectric films where the barrier film is not formed so that the via hole reaches the first-layer wire. In this device, it is preferable that the second-layer wire is electrically connected to the first-layer wire by way of the via hole.

Then, even if the barrier film is made of a conductive material, it is possible to prevent the barrier film and a multilevel interconnection from being short-circuited.

A third semiconductor device according to the present invention includes: a capacitor made up of a lower electrode, a capacitive insulating film of an insulating metal oxide and an upper electrode, the lower electrode, the capacitive insulating film and the upper electrode being stacked in that order over a semiconductor substrate; a passivation film formed over the semiconductor substrate to cover the capacitor; a first-layer wire formed on the passivation film; a first interlevel dielectric film formed on the passivation film to cover the first-layer wire; a barrier film formed on the first interlevel dielectric film to overlap at least part of the capacitor, for preventing hydrogen from diffusing; a second interlevel dielectric film formed over the first interlevel dielectric film and the barrier film; and a second-layer wire formed on the second interlevel dielectric film. In this device, the first interlevel dielectric film is a silicon oxide film deposited by a thermal CVD process, and the second interlevel dielectric film includes at least one film selected from the group consisting of a silicon oxide film deposited by a plasma-enhanced CVD process and a silicon oxyfluoride film deposited by a plasma-enhanced CVD process.

In the third semiconductor device, the first interlevel dielectric film of a silicon oxide is deposited by a thermal CVD process over the first-layer wire formed after the formation of the capacitor including the capacitive insulating film of the insulating metal oxide. Accordingly, the first interlevel dielectric film contains a small amount of hydrogen (including hydrogen ions or hydrogen radicals generated during the deposition of the first interlevel dielectric film), thus suppressing reduction of the capacitive insulating film caused by the hydrogen. In addition, the second interlevel dielectric film is formed over the first interlevel dielectric film with the barrier film, which has been formed to overlap the capacitor and prevents hydrogen from diffusing, interposed therebetween. Thus, hydrogen contained in the second interlevel dielectric film (including hydrogen ions or hydrogen radicals generated during the deposition of the second interlevel dielectric film) is prevented from entering the capacitor and from reducing the capacitive insulating film. In a like manner, the capacitive insulating film is not reduced by hydrogen generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, characteristics of the capacitor are improved.

In the third semiconductor device, the second interlevel dielectric film is a silicon oxide or silicon oxyfluoride film deposited by a plasma-enhanced CVD process, so that the second interlevel dielectric film is easily planarized. Thus, the process step of forming the second-layer wire and the subsequent process steps can be simplified.

A fourth semiconductor device according to the present invention includes: a capacitor made up of a lower electrode, a capacitive insulating film of an insulating metal oxide and an upper electrode, the lower electrode, the capacitive insulating film and the upper electrode being stacked in that order over a semiconductor substrate; a passivation film formed over the semiconductor substrate to cover the capacitor; a first-layer wire formed on the passivation film; a first interlevel dielectric film formed on the passivation film to cover the first-layer wire; a barrier film that is formed on the first interlevel dielectric film to overlap at least part of the capacitor, for preventing moisture from diffusing; a second interlevel dielectric film formed over the first interlevel dielectric film and the barrier film; and a second-layer wire formed on the second interlevel dielectric film. In this device, the first interlevel dielectric film is a silicon oxide film deposited by a thermal CVD process, and the second interlevel dielectric film includes at least one film selected from the group consisting of a silicon oxide film formed by reaction of ozone and TEOS and an SOG film.

In the fourth semiconductor device, the first interlevel dielectric film of a silicon oxide is deposited by a thermal CVD process over the first-layer wire formed after the formation of the capacitor including the capacitive insulating film of the insulating metal oxide. Specifically, the first interlevel dielectric film contains a small amount of moisture, i.e., OH radicals, thus suppressing reduction of the capacitive insulating film caused by the OH radicals. In addition, the second interlevel dielectric film is formed over the first interlevel dielectric film with the barrier film, which has been formed to overlap the capacitor and prevents moisture from diffusing, interposed therebetween. Thus, moisture contained in the second interlevel dielectric film is prevented from entering the capacitor and from reducing the capacitive insulating film. In a like manner, the capacitive insulating film is not reduced by moisture generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

In the fourth semiconductor device, the second interlevel dielectric film is a silicon oxide film formed by reaction of ozone and TEOS or an SOG film, so that the second interlevel dielectric film is easily planarized. Thus, the process step of forming the second-layer wire and the subsequent process steps can be simplified.

A first method for fabricating a semiconductor device according to the present invention includes the steps of forming a capacitor over a semiconductor substrate, the capacitor being made up of a lower electrode, a capacitive insulating film of an insulating metal oxide and an upper electrode; forming a passivation film over the semiconductor substrate so that the capacitor is covered with the passivation film; forming a first-layer wire on the passivation film; forming a first interlevel dielectric film on the passivation film so that the first-layer wire is covered with the first interlevel dielectric film; forming a barrier film, which prevents hydrogen from diffusing, on the first interlevel dielectric film so that the barrier film overlaps at least part of the capacitor; forming a second interlevel dielectric film over the first interlevel dielectric film and the barrier film; and forming a second-layer wire on the second interlevel dielectric film. In this method, the first interlevel dielectric film has a hydrogen content lower than that of the second interlevel dielectric film.

According to the first method, a first interlevel dielectric film having a low hydrogen content is deposited over a first-layer wire formed after the formation of a capacitor including a capacitive insulating film of an insulating metal oxide. Specifically, the first interlevel dielectric film contains a small amount of hydrogen (including hydrogen ions or hydrogen radicals generated during the deposition of the first interlevel dielectric film), thus suppressing reduction of the capacitive insulating film caused by the hydrogen. In addition, a second interlevel dielectric film is formed over the first interlevel dielectric film with a barrier film, which has been formed to overlap the capacitor and prevents hydrogen from diffusing, interposed therebetween. Thus, hydrogen contained in the second interlevel dielectric film (including hydrogen ions or hydrogen radicals generated during the deposition of the second interlevel dielectric film) is prevented from entering the capacitor and from reducing the capacitive insulating film. In a like manner, the capacitive insulating film is not reduced by hydrogen generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

In the first method, the barrier film may prevent moisture from diffusing; and the first interlevel dielectric film may have a moisture content lower than that of the second interlevel dielectric film.

Then, the first interlevel dielectric film contains a small amount of moisture, i.e., OH radicals, thus suppressing reduction of the capacitive insulating film caused by the OH radicals. In addition, the second interlevel dielectric film is formed over the first interlevel dielectric film with the barrier film, which has been formed to overlap the capacitor and prevents moisture from diffusing, interposed therebetween. Thus, moisture contained in the second interlevel dielectric film is prevented from entering the capacitor and from reducing the capacitive insulating film. In addition, the capacitive insulating film is not reduced by moisture generated during a fabrication process after the formation of the second interlevel dielectric film. Accordingly, it is possible to prevent reduction of the capacitive insulating film as intended, thus ensuring improvement of capacitor characteristics.

In the first method the barrier film preferably includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

Then, hydrogen contained in the second interlevel dielectric film or hydrogen generated during a fabrication process after the formation of the second interlevel dielectric film does not enter the capacitor. As a result, it is ensured that deterioration of capacitor characteristics due to reduction of the capacitive insulating film is prevented.

In the first method, the capacitive insulating film preferably includes at least one film selected from the group consisting of: a ferroelectric film having a bismuth-layered perovskite crystal structure; a Pb $(Zr_{1-x}Ti_x)O_3$ film (where $0 \leq x \leq 1$); a $(Ba_{1-y}Sr_y)TiO_3$ film (where $0 \leq y \leq 1$); a $Ta_2O_5$ film, an $Al_2O_3$ film; and an $La_2O_3$ film.

Then, it is possible to implement the capacitor using a reliable high-κ material or ferroelectric for its capacitive insulating film.

The first method preferably includes the step of forming a transistor on the semiconductor substrate before the step of forming the capacitor, and the transistor preferably constitutes a memory cell array with the capacitor. The step of forming the barrier film preferably includes the sub-step of forming the barrier film so that the barrier film overlaps the whole of a region where the memory cell array is provided.

Then, hydrogen, for example, contained in the second interlevel dielectric film does not enter the capacitor. Thus, it is ensured that deterioration of capacitor characteristics due to reduction of the capacitive insulating film is prevented.

In a case where the first method includes the step of forming the transistor, the capacitor may have a planar structure. Specifically, the capacitor may be provided over the semiconductor substrate including the transistor, with an insulating film interposed between the capacitor and the semiconductor substrate. The method may include the step of forming first and second contact holes between the step of forming the passivation film and the step of forming the first-layer wire. The first contact hole may be formed in the passivation film to reach the upper electrode, and the second contact hole may be formed in the passivation film and the insulating film to reach the transistor. The step of forming the first-layer wire may include the sub-step of forming the first-layer wire so that the first and second contact holes are filled with the first-layer wire, thereby electrically connecting the capacitor and the transistor.

In a case where the first method includes the step of forming the transistor, the capacitor may have a stacked structure. Specifically, the capacitor may be provided over the semiconductor substrate including the transistor, with an insulating film interposed between the capacitor and the semiconductor substrate. The method may include the step of forming a plug in the insulating film so that the plug is connected to the transistor before the step of forming the capacitor. The step of forming the capacitor may include the sub-step of forming the lower electrode so that the lower electrode is connected to the plug, thereby electrically connecting the capacitor and the transistor.

In the first method, the step of forming the barrier film preferably includes the sub-step of forming the barrier film so that the barrier film overlaps either one of the lower and upper electrodes.

Then, hydrogen, for example, contained in the second interlevel dielectric film does not enter the capacitor. As a result, it is ensured that deterioration of capacitor characteristics due to reduction of the capacitive insulating film is prevented.

The first method preferably includes the step of forming a via hole in respective regions of the first and second interlevel dielectric films where the barrier film is not formed so that the via hole reaches the first-layer wire, between the step of forming the second interlevel dielectric film and the step of forming the second-layer wire. The step of forming the second-layer wire preferably includes the sub-step of forming the second-layer wire so that the via hole is filled with the second-layer wire, thereby electrically connecting the first- and second-layer wires.

Then, even if the barrier film is made of a conductive material, it is possible to prevent the barrier film and a multilevel interconnection from being short-circuited.

A second method for fabricating a semiconductor device according to the present invention includes the steps of: forming a capacitor over a semiconductor substrate, the capacitor being made up of a lower electrode, a capacitive insulating film of an insulating metal oxide and an upper electrode; forming a passivation film over the semiconductor substrate so that the capacitor is covered with the passivation film; forming a first-layer wire on the passivation film; forming a first interlevel dielectric film on the passivation film so that the first-layer wire is covered with the first interlevel dielectric film; forming a barrier film, which prevents moisture from diffusing, on the first interlevel dielectric film so that the barrier film overlaps at least part of the capacitor; forming a second interlevel dielectric film over the first interlevel dielectric film and the barrier film; and forming a second-layer wire on the second interlevel dielectric film. The first interlevel dielectric film has a moisture content lower than that of the second interlevel dielectric film.

According to the second method, a first interlevel dielectric film having a low moisture content is deposited over a first-layer wire formed after the formation of a capacitor including a capacitive insulating film of an insulating metal oxide. Specifically, the first interlevel dielectric film contains a small amount of moisture, i.e., OH radicals, thus suppressing the OH radicals from reaching the capacitor one after another with the passage of time and from reducing the insulating metal oxide that constitutes the capacitive insulating film. That is to say, reduction of the capacitive insulating film caused by OH radicals is suppressed. In addition, a second interlevel dielectric film is formed over the first interlevel dielectric film with a barrier film, which has been formed to overlap the capacitor and prevents moisture from diffusing, interposed therebetween. Thus, moisture contained in the second interlevel dielectric film is prevented from entering the capacitor and from reducing the capacitive insulating film. In a like manner, the capacitive insulating film is not reduced by moisture generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

In the second method, the barrier film preferably includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

Then, moisture contained in the second interlevel dielectric film or moisture generated during a fabrication process after the formation of the second interlevel dielectric film does not enter the capacitor. As a result, it is ensured that deterioration of capacitor characteristics due to reduction of the capacitive insulating film is prevented.

In the second method, the capacitive insulating film preferably includes at least one film selected from the group consisting of: a ferroelectric film having a bismuth-layered perovskite crystal structure; a Pb $(Zr_{1-x}Ti_x)O_3$ film (where $0 \leq x \leq 1$); a $(Ba_{1-y}Sr_y)TiO_3$ film (where $0 \leq y \leq 1$); a $Ta_2O_5$ film, an $Al_2O_3$ film; and an $La_2O_3$ film.

Then, it is possible to implement the capacitor using a reliable high-κ material or ferroelectric for its capacitive insulating film.

The second method preferably includes the step of forming a transistor on the semiconductor substrate before the step of forming the capacitor, and the transistor preferably constitutes a memory cell array with the capacitor. The step of forming the barrier film preferably includes the sub-step of forming the barrier film so that the barrier film overlaps the whole of a region where the memory cell array is provided.

Then, moisture, for example, contained in the second interlevel dielectric film does not enter the capacitor. Thus, it is ensured that deterioration of capacitor characteristics due to reduction of the capacitive insulating film is prevented.

In a case where the second method includes the step of forming the transistor, the capacitor may have a planar structure. Specifically, the capacitor may be provided over the semiconductor substrate including the transistor, with an insulating film interposed between the capacitor and the semiconductor substrate. The method may include the step of forming first and second contact holes between the step of forming the passivation film and the step of forming the first-layer wire. The first contact hole may be formed in the passivation film to reach the upper electrode, and the second contact hole may be formed in the passivation film and the insulating film to reach the transistor. The step of forming the first-layer wire may include the sub-step of forming the first-layer wire so that the first and second contact holes are filled with the first-layer wire, thereby electrically connecting the capacitor and the transistor.

In a case where the second method includes the step of forming the transistor, the capacitor may have a stacked structure. Specifically, the capacitor may be provided over the semiconductor substrate including the transistor, with an insulating film interposed between the capacitor and the semiconductor substrate. The method may include the step of forming a plug in the insulating film so that the plug is connected to the transistor before the step of forming the capacitor. The step of forming the capacitor may include the sub-step of forming the lower electrode so that the lower electrode is connected to the plug, thereby electrically connecting the capacitor and the transistor.

In the second method, the step of forming the barrier film preferably includes the sub-step of forming the barrier film so that the barrier film overlaps either one of the lower and upper electrodes.

Then, moisture, for example, contained in the second interlevel dielectric film does not enter the capacitor. As a result, it is ensured that deterioration of capacitor characteristics due to reduction of the capacitive insulating film is prevented.

The second method preferably includes the step of forming a via hole in respective regions of the first and second interlevel dielectric films where the barrier film is not formed so that the via hole reaches the first-layer wire, between the step of forming the second interlevel dielectric film and the step of forming the second-layer wire. The step of forming the second-layer wire preferably includes the sub-step of forming the second-layer wire so that the via hole is filled with the second-layer wire, thereby electrically connecting the first- and second-layer wires.

Then, even if the barrier film is made of a conductive material, it is possible to prevent the barrier film and a multilevel interconnection from being short-circuited.

A third method for fabricating a semiconductor device according to the present invention includes the steps of: forming a capacitor over a semiconductor substrate, the capacitor being made up of a lower electrode, a capacitive insulating film of an insulating metal oxide and an upper electrode; forming a passivation film over the semiconductor substrate so that the capacitor is covered with the passivation film; forming a first-layer wire on the passivation film; forming a first interlevel dielectric film on the passivation film so that the first-layer wire is covered with the first interlevel dielectric film; forming a barrier film, which prevents hydrogen from diffusing, on the first interlevel dielectric film so that the barrier film overlaps at least part of the capacitor; forming a second interlevel dielectric film over the first interlevel dielectric film and the barrier film; and forming a second-layer wire on the second interlevel dielectric film. In this method, the first interlevel dielectric film is a silicon oxide film deposited by a thermal CVD process, and the second interlevel dielectric film includes at least one film selected from the group consisting of a silicon oxide film deposited by a plasma-enhanced CVD process and a silicon oxyfluoride film deposited by a plasma-enhanced CVD process.

According to the third method, a first interlevel dielectric film of a silicon oxide is deposited by a thermal CVD process over a first-layer wire formed after a capacitor including a capacitive insulating film of an insulating metal oxide has been formed. Accordingly, the first interlevel dielectric film contains a small amount of hydrogen (including hydrogen ions or hydrogen radicals generated during the deposition of the first interlevel dielectric film), thus suppressing reduction of the capacitive insulating film caused by the hydrogen. In addition, a second interlevel dielectric film is formed over the first interlevel dielectric film with a barrier film, which has been formed to overlap the capacitor and prevents hydrogen from diffusing, interposed therebetween. Thus, hydrogen contained in the second interlevel dielectric film (including hydrogen ions or hydrogen radicals generated during the deposition of the second interlevel dielectric film) is prevented from entering the capacitor and from reducing the capacitive insulating film. In a like manner, the capacitive insulating film is not reduced by hydrogen generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

Also, according to the third method, the second interlevel dielectric film is a silicon oxide or silicon oxyfluoride film deposited by a plasma-enhanced CVD process, so that the second interlevel dielectric film is easily planarized. Thus, the process step of forming the second-layer wire and the subsequent process steps can be simplified.

A fourth method for fabricating a semiconductor device according to the present invention includes the steps of: forming a capacitor over a semiconductor substrate, the capacitor being made up of a lower electrode, a capacitive insulating film of an insulating metal oxide and an upper electrode; forming a passivation film over the semiconductor substrate so that the capacitor is covered with the passivation film; forming a first-layer wire on the passivation film; forming a first interlevel dielectric film on the passivation film so that the first-layer wire is covered with the first interlevel dielectric film; forming a barrier film, which prevents moisture from diffusing, on the first interlevel dielectric film so that the barrier film overlaps at least part of the capacitor; forming a second interlevel dielectric film over the first interlevel dielectric film and the barrier film; and forming a second-layer wire on the second interlevel dielectric film. In this method, the first interlevel dielectric film is a silicon oxide film deposited by a thermal CVD process, and the second interlevel dielectric film includes at least one film selected from the group consisting of a silicon oxide film formed by reaction of ozone and TEOS and an SOG film.

According to the fourth method, a first interlevel dielectric film of a silicon oxide is deposited by a thermal CVD process over a first-layer wire formed after the formation of a capacitor including a capacitive insulating film of an insulating metal oxide. Accordingly, the first interlevel dielectric film contains a small amount of moisture, i.e., OH radicals, thus suppressing reduction of the capacitive insulating film caused by the OH radicals. In addition, a second interlevel dielectric film is formed over the first interlevel dielectric film with a barrier film, which has been formed to overlap the capacitor and prevents moisture from diffusing, interposed therebetween. Thus, moisture contained in the second interlevel dielectric film is prevented from entering the capacitor and from reducing the capacitive insulating film. In a like manner, the capacitive insulating film is not reduced by moisture generated during a fabrication process performed after the formation of the second interlevel dielectric film. Accordingly, it is possible to prevent reduction of the capacitive insulating film when a high-temperature oxygen annealing cannot be used after the formation of the first-layer wire. As a result, capacitor characteristics are improved.

Also, according to the fourth method, the second interlevel dielectric film is a silicon oxide film formed by reaction of ozone and TEOS or an SOG film, so that the second interlevel dielectric film is easily planarized. Thus, the process step of forming the second-layer wire and the subsequent process steps can be simplified.

BEST MODE FOR CARRYING OUT THE INVENTION

Embodiment 1

Hereinafter, a semiconductor device and a method for fabricating the device in accordance with a first embodiment of the present invention will be described with reference to the drawings.

FIGS. 1(a), 1(b), FIGS. 2(a), 2(b) and FIG. 3 are cross-sectional views showing respective process steps for fabricating a semiconductor device according to the first embodiment.

Figure 1A:
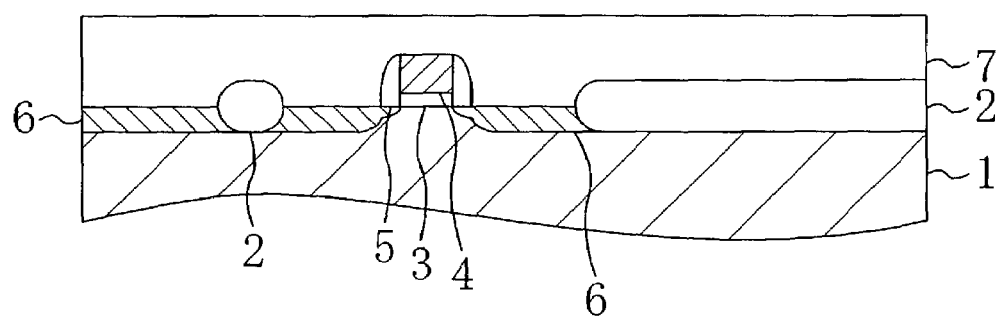
FIGS. 1(a) and 1(b) are cross-sectional views showing respective process steps for fabricating a semiconductor device according to a first embodiment of the present invention.

First, as shown in FIG. 1(a), an isolating insulating film 2 is provided on a semiconductor substrate 1 so that a transistor region is defined, and a gate electrode 4 is formed over the transistor region with a gate insulating film 3 interposed therebetween. Then, an insulating sidewall 5 is formed on side faces of the gate electrode 4, and a doped layer 6 to be source/drain regions is defined in the transistor region of the semiconductor substrate 1. Thereafter, a first passivation film 7 is deposited over the entire surface of the semiconductor substrate 1 where a transistor (a switching transistor) made up of the gate electrode 4, the doped layer 6, and so on has been provided.

Figure 1B:
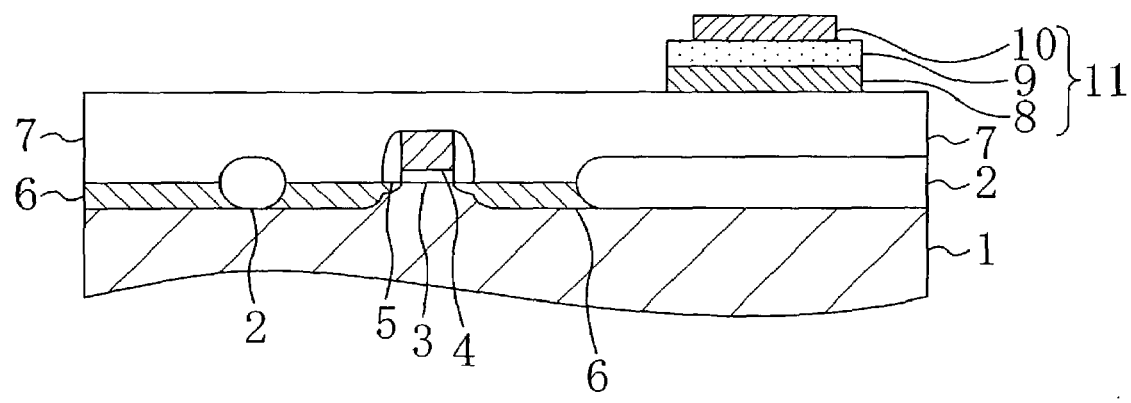

Next, as shown in FIG. 1(b), a capacitor 11 made up of lower electrode 8, capacitive insulating film 9 of an insulating metal oxide, and upper electrode 10 is formed on the first passivation film 7. Specifically, a lower-electrode-prototype conductor film in which a titanium oxide film and a platinum film, for example, are stacked in that order is formed on the first passivation film 7. Thereafter, a capacitive-insulating-film-prototype insulating film of an insulating metal oxide such as $SrBi_2(Ta_{1-z}Nb_z)_2O_9$ (where $0 \leq z \leq 1$) is deposited to a thickness of about 100 nm to about 250 nm on the lower-electrode-prototype conductor film. The $SrBi_2(Ta_{1-z}Nb_z)_2O_9$ is a ferroelectric having a bismuth-layered perovskite crystal structure. Subsequently, an upper-electrode-prototype conductor film where a platinum film and a titanium (or titanium nitride) film are stacked in that order is formed on the capacitive-insulating-film-prototype insulating film. Then, the upper-electrode-prototype conductor film is dry-etched using a mask pattern covering a region where the upper electrode is to be formed, thus forming the upper electrode 10. Then, the capacitive-insulating-film-prototype insulating film and the lower-electrode-prototype conductor film are dry-etched in that order using a mask pattern covering a region where a lower electrode is to be formed, thereby forming the capacitive insulating film 9 and the lower electrode 8. In this manner, the formation of the capacitor 11 is completed.

In the first embodiment, memory cells, each made up of a set of the capacitor 11 and the switching transistor, are integrated on the semiconductor substrate 1, thereby constituting a memory cell array.

Figure 2A:
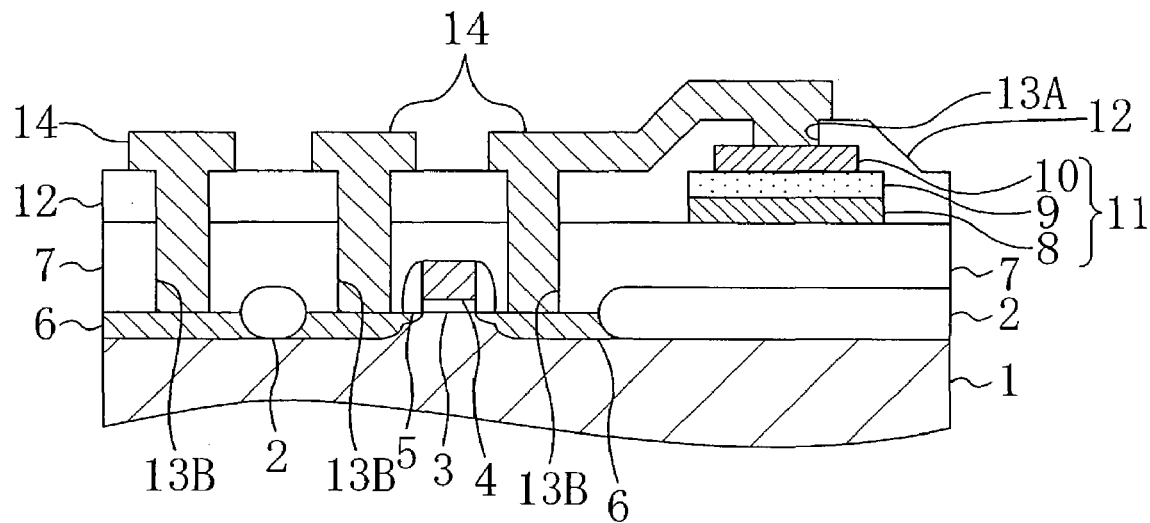
FIGS. 2(a) and 2(b) are cross-sectional views showing respective process steps for fabricating the semiconductor device of the first embodiment.

Then, as shown in FIG. 2(a), a second passivation film 12 is deposited over the first passivation film 7 to cover the capacitor 11. Thereafter, a first contact hole 13A is formed in the second passivation film 12 to reach the upper electrode 10, and a second contact hole 13B is formed in the first and second passivation films 7 and 12 to reach the doped layer 6 of the switching transistor. Then, a first-layer-wire-prototype conductor film in which titanium film, titanium nitride film, aluminum film, and titanium nitride film, for example, are stacked in that order is formed over the entire surface of the second passivation film 12 to fill in the first and second contact holes 13A and 13B. Subsequently, the first-layer-wire-prototype conductor film is dry-etched using a mask pattern covering a region where a first-layer wire is to be formed, thereby forming a first-layer wire 14. In this case, the first and second contact holes 13A and 13B are filled with parts of the first-layer wire 14, thereby electrically connecting the capacitor 11 and the switching transistor and also electrically connecting the switching transistor and another switching transistor. In other words, the capacitor 11 has a planar structure.

Figure 2B:
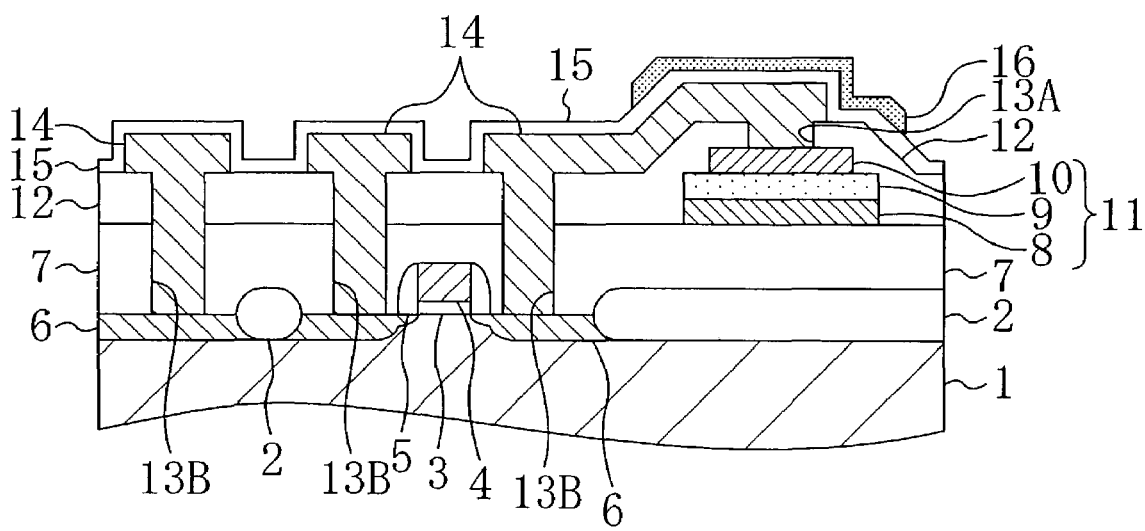

Subsequently, as shown in FIG. 2(b), a first interlevel dielectric film 15 is deposited to a thickness of about 50 nm to about 300 nm over the second passivation film 12 to cover the first-layer wire 14. As the first interlevel dielectric film 15, an insulating film with a low hydrogen content (the proportion of the mass of hydrogen contained in the total mass of the interlevel dielectric film per unit volume) such as a silicon oxide film deposited by a thermal CVD process is used. Specifically, a thermal CVD process is performed using silane, oxygen and dinitrogen oxide ($N_2O$) as main components at a substrate temperature of about 400° C., thereby depositing the first interlevel dielectric film 15. Thereafter, a barrier film 16, which prevents hydrogen from diffusing and has a thickness of about 50 nm to about 200 nm, is formed on the first interlevel dielectric film 15 so as to overlap part of or the whole of the capacitor 11. As the barrier film 16, a titanium film or a titanium nitride film is used, for example.

Figure 3:
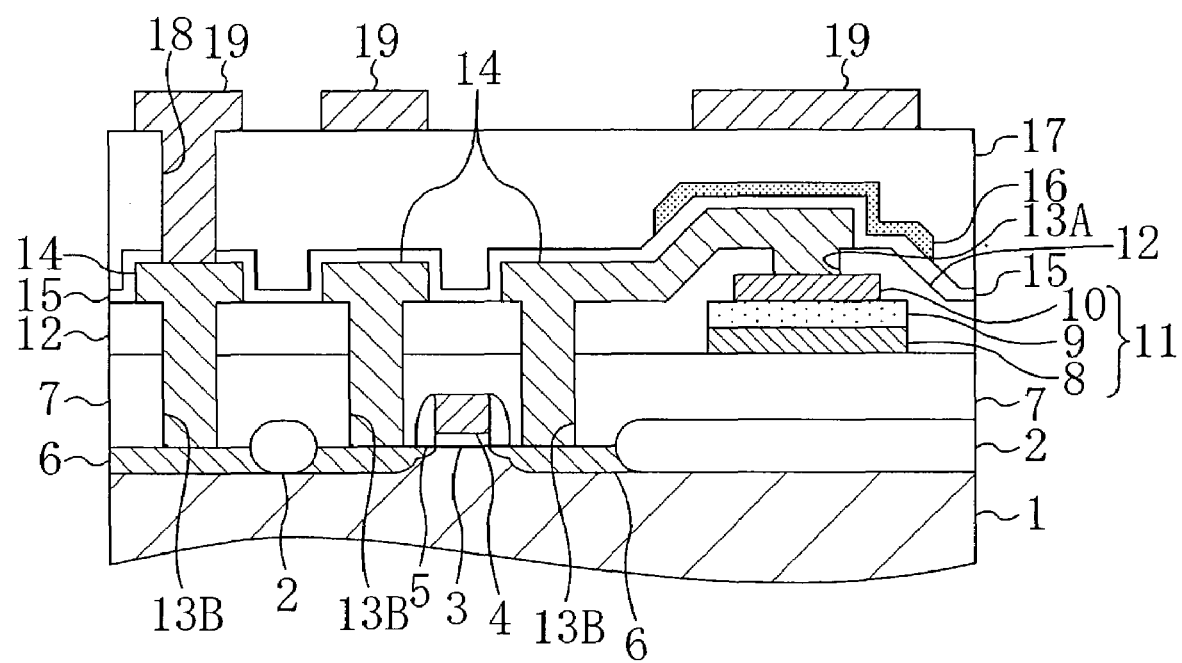
FIG. 3 is a cross-sectional view showing a process step for fabricating the semiconductor device of the first embodiment.

Then, as shown in FIG. 3, a second interlevel dielectric film 17 is deposited to a thickness of about 600 nm to about 1500 nm over the first interlevel dielectric film 15 and the barrier film 16, and then the surface of the second interlevel dielectric film 17 is planarized. As the second interlevel dielectric film 17, an insulating film which can be planarized easily such as a silicon oxide or silicon oxyfluoride film deposited by a plasma-enhanced CVD process, for example, is used. In this case, the second interlevel dielectric film 17 has a hydrogen content higher than that of the first interlevel dielectric film 15. Thereafter, a via hole 18 is formed in respective regions of the first and second interlevel dielectric films 15 and 17 where the barrier film 16 is not formed so that the via hole 18 is formed to reach a predetermined area of the first-layer wire 14. Subsequently, a second-layer-wire-prototype conductor film in which titanium film, aluminum film and titanium nitride film, for example, are stacked in that order is formed on the second interlevel dielectric film 17 as well as in the via hole 18. Then, the second-layer-wire-prototype conductor film is dry-etched using a mask pattern covering a region where a second-layer wire is to be formed, thereby forming a second-layer wire 19. In this case, the via hole 18 is filled with part of the second-layer wire 19, thereby electrically connecting the first-layer wire 14 and the second-layer wire 19. It is noted that if the aspect ratio (i.e., the ratio of hole depth to hole diameter) of the via hole 18 is one or higher, a tungsten plug may be formed in the via hole 18.

As described above, according to the first embodiment, the first interlevel dielectric film 15 having a low hydrogen content, i.e., the first interlevel dielectric film 15 of a silicon oxide deposited by a thermal CVD process, is formed over the first-layer wire 14 formed after the formation of the capacitor 11 including the capacitive insulating film 9 of an insulating metal oxide. Specifically, the first interlevel dielectric film 15 contains a small amount of hydrogen (including hydrogen ions or hydrogen radicals generated during the deposition of the first interlevel dielectric film 15), thus suppressing reduction of the capacitive insulating film 9 caused by the hydrogen. In addition, the second interlevel dielectric film 17 is formed over the first interlevel dielectric film 15 with the barrier film 16, which has been formed to overlap the capacitor 11 and prevents hydrogen from diffusing, interposed therebetween. Thus, hydrogen contained in the second interlevel dielectric film 17 (including hydrogen ions or hydrogen radicals generated during the deposition of the second interlevel dielectric film 17) is prevented from entering the capacitor 11 and from reducing the capacitive insulating film 9. In a like manner, the capacitive insulating film 9 is not reduced by hydrogen generated during a fabrication process performed after the formation of the second interlevel dielectric film 17. Accordingly, it is possible to prevent reduction of the capacitive insulating film 9 when a high-temperature oxygen annealing cannot be used after the formation of the first-layer wire 14. As a result, characteristics of the capacitor 11 are improved.

Also, according to the first embodiment, the second interlevel dielectric film 17 is a silicon oxide or silicon oxyfluoride film deposited by a plasma-enhanced CVD process, so that the second interlevel dielectric film 17 is easily planarized. Thus, the process step of forming the second-layer wire 19 and the subsequent process steps can be simplified.

Figure 4:
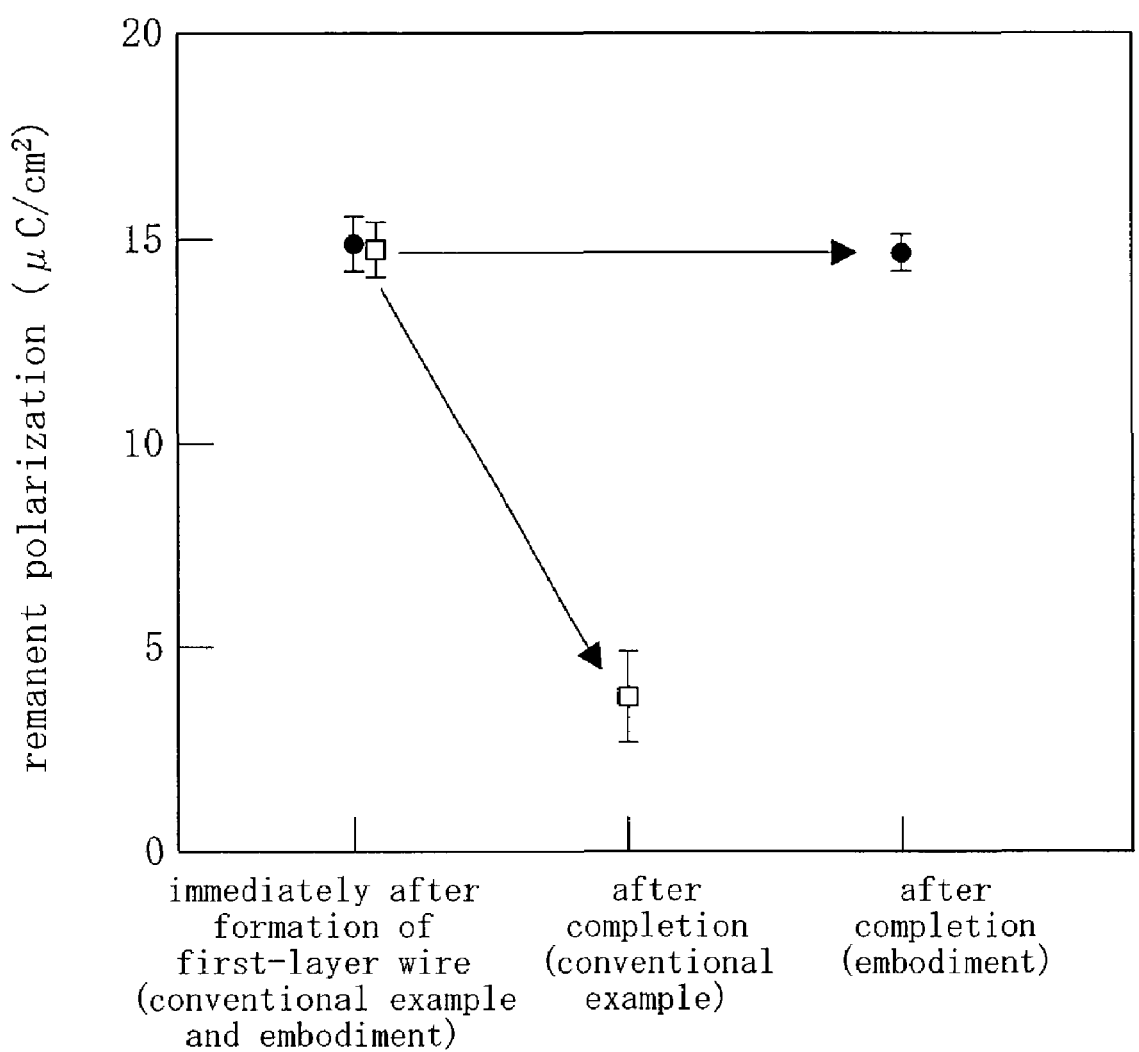
FIG. 4 is a graph showing the results of comparing remanent polarizations in capacitors for the semiconductor device of the first embodiment and a conventional semiconductor device.

Next, with respect to the semiconductor device of the first embodiment (which will be hereinafter simply referred to this embodiment in some cases) and the conventional semiconductor device shown in FIG. 10 (which will be hereinafter simply referred to conventional example in some cases), the results of comparing respective capacitor characteristics, more specifically, remanent polarizations in the respective capacitors will be described with reference to FIG. 4. In FIG. 4, the black circles indicate the remanent polarization in the capacitor in this embodiment, while the white squares indicate the remanent polarization in the capacitor of the conventional example.

As shown in FIG. 4, in the conventional example, the capacitor 111 exhibits a remanent polarization of 15 $\mu C/cm^2$ immediately after the first-layer wire 117 has been formed, while exhibiting a remanent polarization of 4 $\mu C/cm^2$ after the device has been fabricated. On the other hand, in this embodiment, the capacitor 11 exhibits a remanent polarization of 15 $\mu C/cm^2$ immediately after the first-layer wire 14 has been formed, while exhibiting a remanent polarization of 14.7 $\mu C/cm^2$ after the device has been fabricated.

That is to say, characteristics of the capacitor 111 are deteriorated seriously, and vary widely after the formation of the first-layer wire 117 in the conventional example. This is because the capacitive insulating film 109 is reduced by hydrogen or moisture that has entered the capacitor 111, to have characteristics of the capacitor 111 deteriorated.

On the other hand, in this embodiment, characteristics of the capacitor 11 are hardly deteriorated after the first-layer wire 14 has been formed, and do not vary so widely. This is because of the following reasons: Specifically, a silicon oxide film deposited by a thermal CVD process is used as the first interlevel dielectric film 15 in this embodiment. Thus, the first interlevel dielectric film 15 can be formed without using a plasma, so that no active hydrogen ions or hydrogen radicals is generated during the deposition of the first interlevel dielectric film 15. Also, the deposited first interlevel dielectric film 15 contains a very small amount of moisture. As a result, the reduction of the capacitive insulating film 9 caused by hydrogen or moisture is almost perfectly suppressed.

Also, in the first embodiment, the first interlevel dielectric film 15 has a hydrogen content lower than that of the second interlevel dielectric film 17. Alternatively, the mass of hydrogen contained per unit volume of the first interlevel dielectric film 15 may be smaller than that of the second interlevel dielectric film 17.

Further, in the first embodiment, the barrier film 16 prevents moisture from diffusing, and the moisture content of the first interlevel dielectric film 15 (or the mass of moisture contained per unit volume of the first interlevel dielectric film 15) is preferably lower than that of the second interlevel dielectric film 17 (of the mass of moisture contained per unit volume of the second interlevel dielectric film 17).

Then, the first interlevel dielectric film 15 contains a small amount of moisture, i.e., OH radicals, so that reduction of the capacitive insulating film 9 caused by the OH radicals is suppressed. In addition, the second interlevel dielectric film 17 is formed over the first interlevel dielectric film 15 with the barrier film 16, which has been formed to overlap the capacitor 11 and prevents moisture from diffusing, interposed between the first and second interlevel dielectric films 15 and 17. Thus, moisture contained in the second interlevel dielectric film 17 is prevented from entering the capacitor 11 and from reducing the capacitive insulating film 9. Moreover, the capacitive insulating film 9 is not reduced by moisture generated during a fabrication process after the second interlevel dielectric film 17 has been formed. Accordingly, the reduction of the capacitive insulating film 9 is prevented as intended, thus further ensuring improvement of characteristics of the capacitor 11.

In the first embodiment, the silicon oxide film deposited by a thermal CVD process is used as the first interlevel dielectric film 15. However, the present invention is not limited to this specific embodiment and another insulating film with a low hydrogen content (or the mass of hydrogen contained per unit volume) may be used alternatively.

Also, in the first embodiment, the silicon oxide or silicon oxyfluoride film deposited by a plasma-enhanced CVD process is used as the second interlevel dielectric film 17.

However, the present invention is not limited to this specific embodiment and another insulating film that can be easily planarized may be used alternatively.

Further, in the first embodiment, the barrier film 16 preferably includes at least one film selected from the group consisting of titanium film, titanium oxide film, tantalum film, tantalum oxide film, alumina film, silicon nitride film, silicon oxynitride film, aluminum titanium nitride film, and alloy film of titanium and aluminum, for example. Then, hydrogen contained in the second interlevel dielectric film 17 or hydrogen generated during a fabrication process after the formation of the second interlevel dielectric film 17 does not enter the capacitor 11. As a result, it is ensured that deterioration of characteristics of the capacitor 11 due to reduction of the capacitive insulating film 9 is prevented.

Moreover, in the first embodiment, the capacitive insulating film 9 preferably includes at least one film selected from the group consisting of ferroelectric film having a bismuth-layered perovskite crystal structure (e.g., a $SrBi_2(Ta_{1-z}Nb_z)_2O_9$ film where $0 \leq z \leq 1$), $Pb(Zr_{1-x}Ti_x)O_3$ film (where $0 \leq x \leq 1$), $(Ba_{1-y}Sr_y)TiO_3$ film (where $0 \leq y \leq 1$), $Ta_2O_5$ film, $Al_2O_3$ film and $La_2O_3$ film, for example. Then, it is possible to implement the capacitor 11 using a reliable high-κ material or ferroelectric for its capacitive insulating film 9.

Furthermore, in the first embodiment, the via hole 18, which reaches the first-layer wire 14 and is filled with part of the second-layer wire 19, is preferably formed in respective regions of the first and second interlevel dielectric films 15 and 17 where the barrier film 16 is not formed. Then, even if the barrier film 16 is made of a conductive material, it is possible to prevent the barrier film 16 and a multilevel interconnection from being short-circuited.

Hereinafter, it will be described how the barrier film 16 is disposed in the semiconductor device of the first embodiment.

Figure 5A:
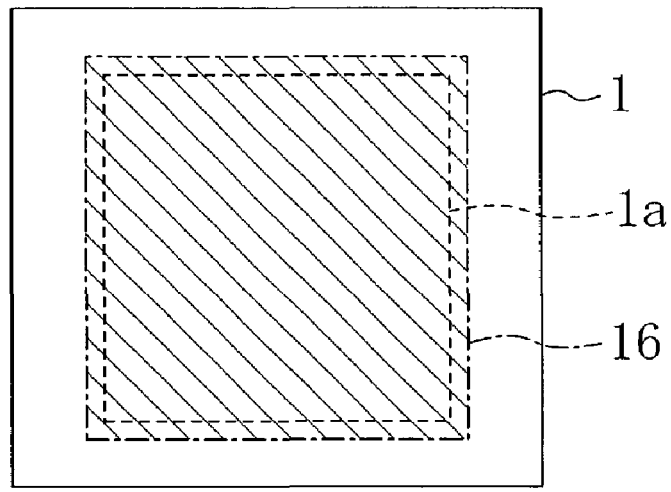
FIGS. 5(a) through 5(c) are views showing how a barrier film is disposed in the semiconductor device of the first embodiment.
Figure 5B:
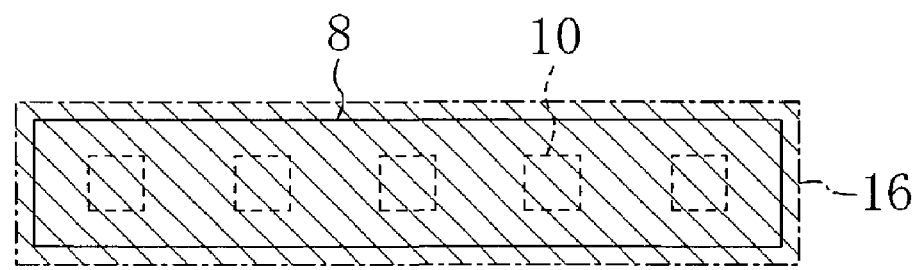
Figure 5C:
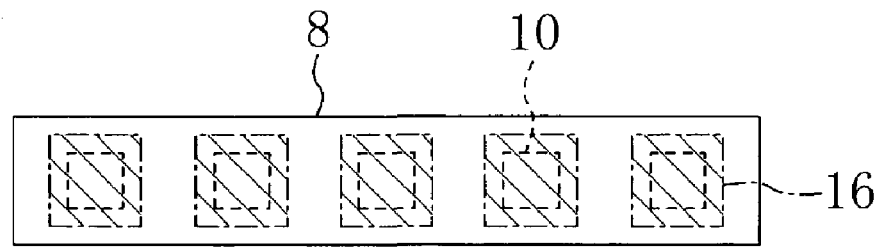

FIGS. 5(a) through 5(c) schematically illustrate the barrier film 16 as viewed from above.

As shown in FIG. 5(a), for example, the barrier film 16 may be disposed to overlap the whole of a region 1a of the semiconductor substrate 1 where a memory cell array is provided. Alternatively, as shown in FIG. 5(b), the barrier film 16 may be disposed to overlap the whole of the lower electrode 8 to be a cell plate for memory cells. Alternatively, as shown in FIG. 5(c), the barrier film 16 may be disposed to overlap each of the upper electrodes 10 to be a storage node of the memory cells. By disposing the barrier film 16 in such a way as shown in any of FIGS. 5(a) through 5(c), it is ensured that hydrogen is prevented from entering the capacitor 11 during the process step of forming the second interlevel dielectric film 17 or the subsequent fabrication process steps, resulting in improving characteristics of the capacitor 11. It should be noted that the disposition of the barrier film 16 is not limited to the examples shown in FIGS. 5(a) through 5(c) in the first embodiment.

Embodiment 2

Hereinafter, a semiconductor device and a method for fabricating the device in accordance with a second embodiment of the present invention will be described with reference to the drawings.

FIGS. 6(a) through 6(c), FIGS. 7(a), 7(b) and FIGS. 8(a), 8(b) are cross-sectional views showing respective process steps for fabricating a semiconductor device according to the second embodiment.

Figure 6A:
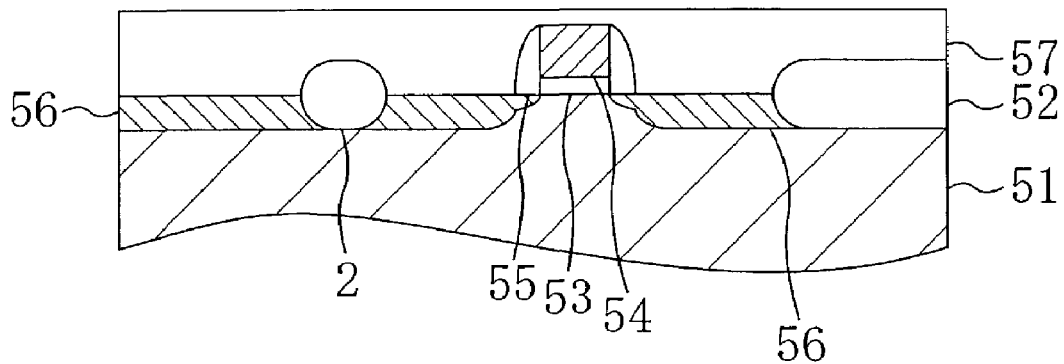
FIGS. 6(a) through 6(c) are cross-sectional views showing respective process steps for fabricating a semiconductor device according to a second embodiment of the present invention.

First, as shown in FIG. 6(a), an isolating insulating film 52 is provided on a semiconductor substrate 51 so that a transistor region is defined, and a gate electrode 54 is formed over the transistor region with a gate insulating film 53 interposed therebetween. Then, an insulating sidewall 55 is formed on side faces of the gate electrode 54, and a doped layer 56 to be source/drain regions is defined in the transistor region of the semiconductor substrate 51. Thereafter, a first passivation film 57 is deposited over the entire surface of the semiconductor substrate 51 where a transistor (a switching transistor) made up of the gate electrode 54, the doped layer 56, and so on has been provided.

Figure 6B:
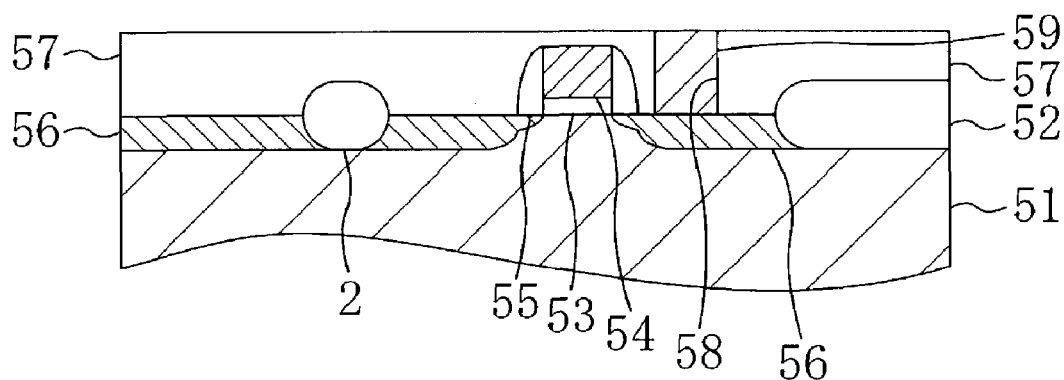

Next, as shown in FIG. 6(b), a first contact hole 58 is formed in the first passivation film 57 to reach the doped layer 56 of the switching transistor. Thereafter, a conductor film of tungsten or polysilicon is formed over the entire surface of the first passivation film 57 to fill in the first contact hole 58 completely. Then, the excessive parts of the conductor film outside of the first contact hole 58 are removed by an etch back or a CMP (chemical mechanical polishing) process, thereby forming a contact plug 59 that is connected to the doped layer 56 of the switching transistor.

Figure 6C:
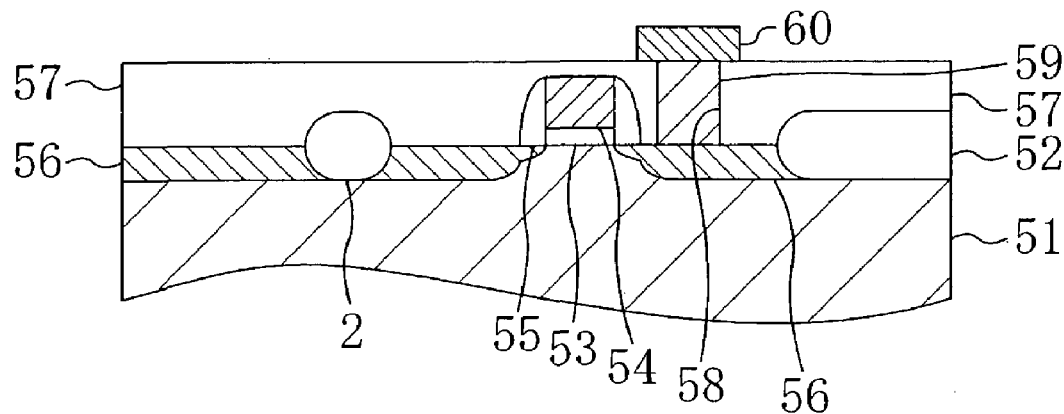

Then, a lower-electrode-prototype conductor film in which titanium film, aluminum titanium nitride film, iridium film, iridium oxide film and platinum film, for example, are stacked in that order is formed on the first passivation film 57 including the surface of the contact plug 59. Subsequently, the lower-electrode-prototype conductor film is dry-etched using a mask pattern covering a region where a lower electrode is to be formed, thereby forming a lower electrode 60 that is connected to the contact plug 59 as shown in FIG. 6(c).

Figure 7A:
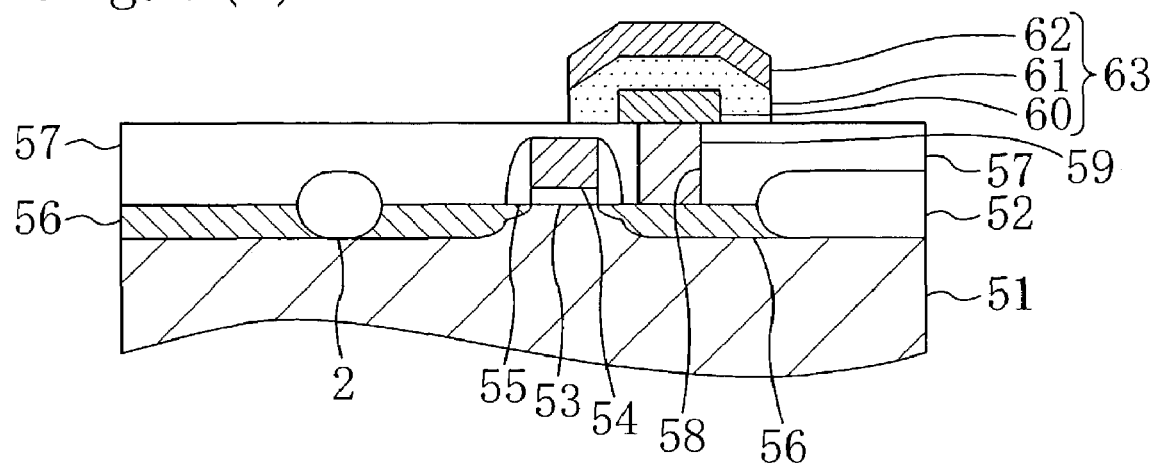
FIGS. 7(a) and 7(b) are cross-sectional views showing respective process steps for fabricating the semiconductor device of the second embodiment.

Thereafter, a capacitive-insulating-film-prototype insulating film of an insulating metal oxide such as $SrBi_2(Ta_{1-z}Nb_z)_2O_9$ (where $0 \leq z \leq 1$) is deposited to a thickness of about 100 nm to about 250 nm on the first passivation film 57 so as to cover the upper and side faces of the lower electrode 60. The $SrBi_2(Ta_{1-z}Nb_z)_2O_9$ is a ferroelectric having a bismuth-layered perovskite crystal structure. Subsequently, an upper-electrode-prototype conductor film of platinum is formed on the capacitive-insulating-film-prototype insulating film. Then, the upper-electrode-prototype conductor film and the capacitive-insulating-film-prototype insulating film are dry-etched in this order using a mask pattern covering a region where an upper electrode is to be formed, thereby forming an upper electrode 62 and a capacitive insulating film 61 as shown in FIG. 7(a). The upper electrode 62 covers the upper face of the capacitive insulating film 61, which covers the upper and side faces of the lower electrode 60. In this manner, a capacitor 63 made up of the lower electrode 60, the capacitive insulating film 61 and the upper electrode 62 is formed. The capacitor 63 is electrically connected to the switching transistor by way of the contact plug 59 that is connected to the lower electrode 60. That is to say, the capacitor 63 has a stacked structure.

In the second embodiment, memory cells, each made up of a set of the capacitor 63 and the switching transistor, are integrated on the semiconductor substrate 51, thereby constituting a memory cell array.

Figure 7B:
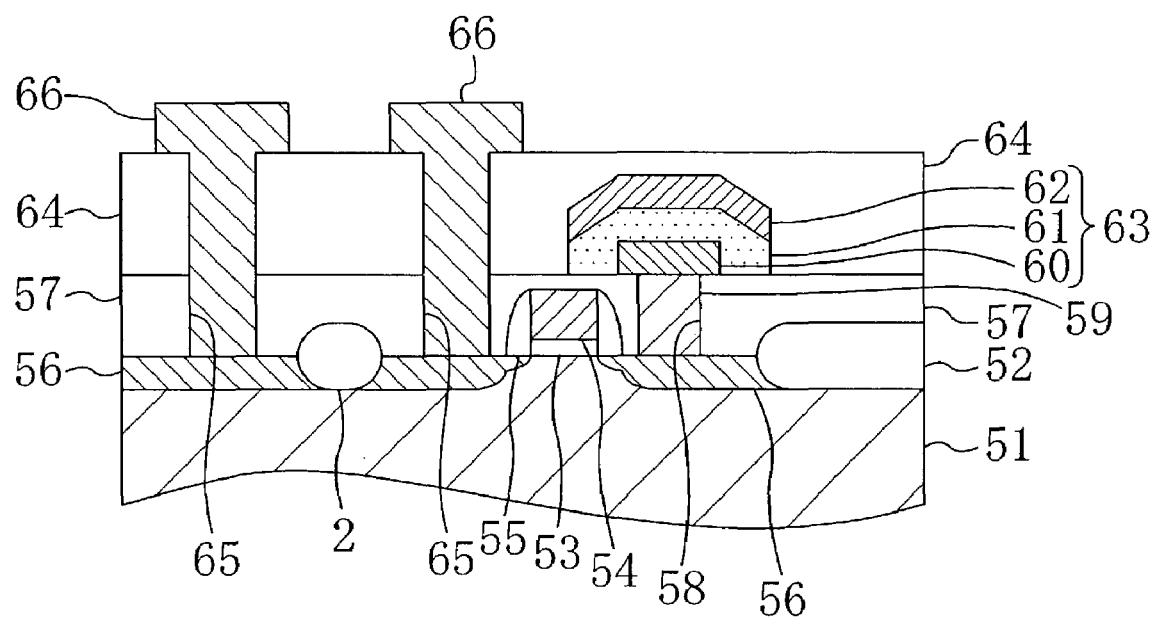

Then, as shown in FIG. 7(b), a second passivation film 64 is deposited over the first passivation film 57 to cover the capacitor 63. Thereafter, a second contact hole 65 is formed in the first and second passivation films 57 and 64 to reach the doped layer 56 of the switching transistor. Subsequently, a first-layer-wire-prototype conductor film in which titanium film, titanium nitride film, aluminum film, and titanium nitride film, for example, are stacked in that order is formed to fill in the second contact hole 65. Then, the first-layer-wire-prototype conductor film is dry-etched using a mask pattern covering a region where a first-layer wire is to be formed, thereby forming a first-layer wire 66. In this case, the second contact hole 65 is filled with part of the first-layer wire 66, thereby electrically connecting the switching transistor and another switching transistor.

Figure 8A:
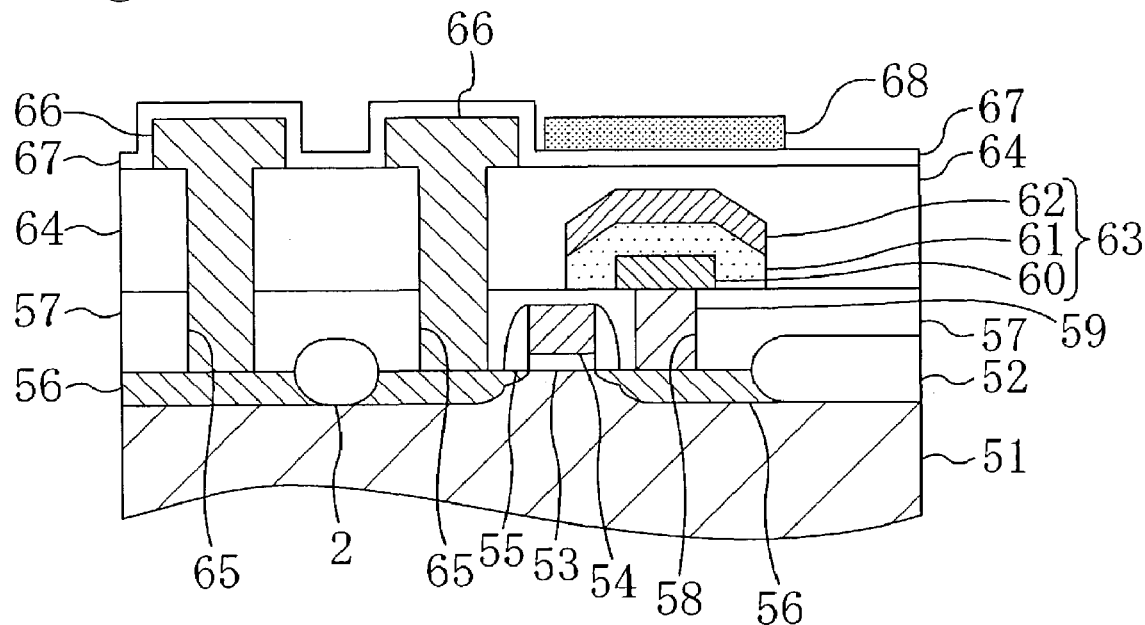
FIGS. 8(a) and 8(b) are cross-sectional views showing respective process steps for fabricating the semiconductor device of the second embodiment.

Subsequently, as shown in FIG. 8(a), a first interlevel dielectric film 67 is deposited to a thickness of about 50 nm to about 300 nm over the second passivation film 64 to cover the first-layer wire 66. As the first interlevel dielectric film 67, an insulating film with a low moisture content (the proportion of the mass of moisture contained in the total mass of the interlevel dielectric film per unit volume) such as a silicon oxide film deposited by a thermal CVD process is used. Specifically, a thermal CVD process is performed using silane, oxygen and dinitrogen oxide ($N_2O$) as main components at a substrate temperature of about 400° C., thereby depositing the first interlevel dielectric film 67. Thereafter, a barrier film 68, which prevents moisture from diffusing and has a thickness of about 50 nm to about 200 nm, is formed on the first interlevel dielectric film 67 so as overlap part of or the whole of the capacitor 63. As the barrier film 68, a titanium film or a titanium nitride film is used, for example.

Figure 8B:
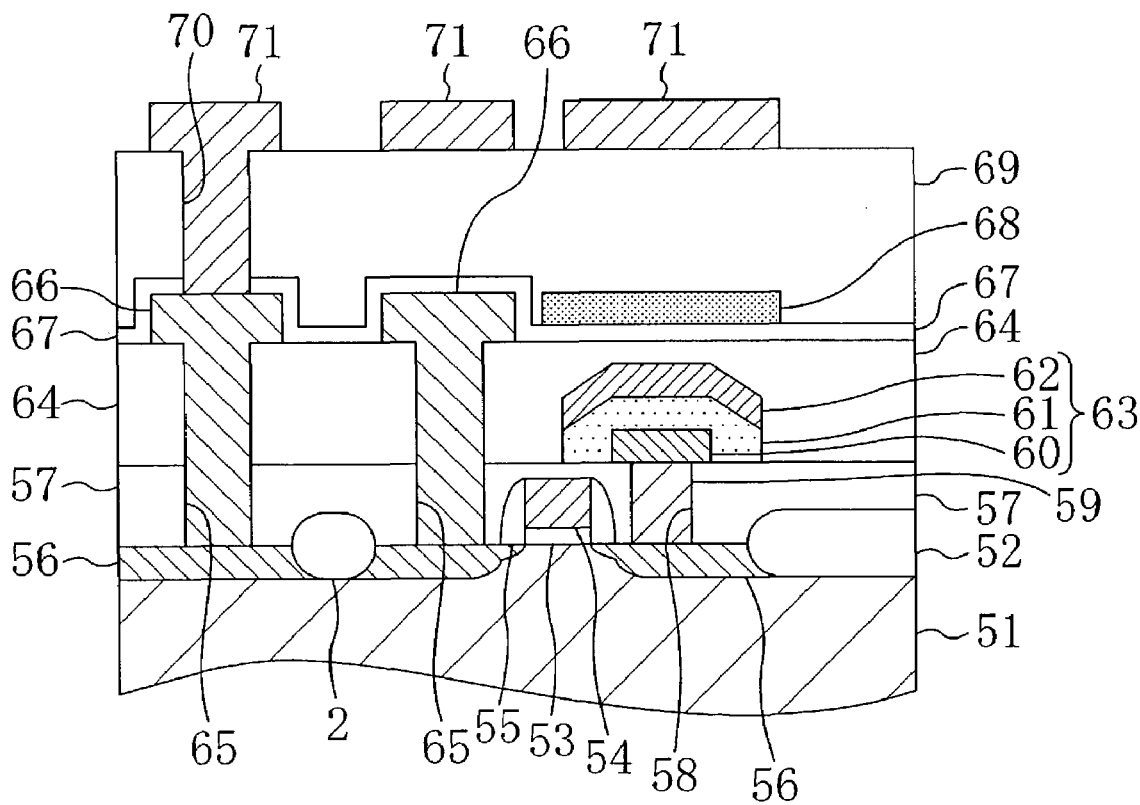

Then, as shown in FIG. 8(b), a second interlevel dielectric film 69 is deposited to a thickness of about 600 nm to about 1500 nm over the first interlevel dielectric film 67 and the barrier film 68, and then the surface of the second interlevel dielectric film 69 is planarized. As the second interlevel dielectric film 69, an insulating film which can be planarized easily such as a silicon oxide film formed by chemical reaction of ozone and TEOS or an SOG film formed by an SOG process is used. In this case, the second interlevel dielectric film 69 has a moisture content higher than that of the first interlevel dielectric film 67. Thereafter, a via hole 70 is formed in respective regions of the first and second interlevel dielectric films 67 and 69 where the barrier film 68 is not formed so that the via hole 70 reaches a predetermined area of the first-layer wire 66. Subsequently, a second-layer-wire-prototype conductor film in which titanium film, aluminum film and titanium nitride film, for example, are stacked in that order is formed on the second interlevel dielectric film 69 as well as in the via hole 70. Then, the second-layer-wire-prototype conductor film is dry-etched using a mask pattern covering a region where a second-layer wire is to be formed, thereby forming a second-layer wire 71. In this case, the via hole 70 is filled with part of the second-layer wire 71, thereby electrically connecting the first-layer wire 66 and the second-layer wire 71. It is noted that if the aspect ratio of the via hole 70 is one or higher, a tungsten plug may be formed in the via hole 70.

As described above, according to the second embodiment, the first interlevel dielectric film 67 having a low moisture content, i.e., the first interlevel dielectric film 67 of a silicon oxide deposited by a thermal CVD process, is formed over the first-layer wire 66 formed after the formation of the capacitor 63 including the capacitive insulating film 61 of an insulating metal oxide. Specifically, the first interlevel dielectric film 67 contains a small amount of moisture, i.e., OH radicals, thus suppressing reduction of the insulating metal oxide constituting the capacitive insulating film 61 caused by the OH radicals that have reached the capacitor 63 one after another with the passage of time. In other words, it is possible to suppress reduction of the capacitive insulating film 61 caused by the OH radicals. In addition, the second interlevel dielectric film 69 is formed over the first interlevel dielectric film 67 with the barrier film 68, which has been formed to overlap the capacitor 63 and prevents moisture from diffusing, interposed therebetween. Thus, moisture contained in the second interlevel dielectric film 69 is prevented from entering the capacitor 63 and from reducing the capacitive insulating film 61. In a like manner, the capacitive insulating film 61 is not reduced by moisture generated during a fabrication process performed after the formation of the second interlevel dielectric film 69. Accordingly, it is possible to prevent reduction of the capacitive insulating film 61 when a high-temperature oxygen annealing cannot be used after the formation of the first-layer wire 66. As a result, characteristics of the capacitor 63 are improved.

Also, according to the second embodiment, the second interlevel dielectric film 69 is a silicon oxide film formed by reaction of ozone and TEOS or an SOG film, so that the second interlevel dielectric film 69 is easily planarized. Thus, the process step of forming the second-layer wire 71 and the subsequent process steps can be simplified.

Figure 10:
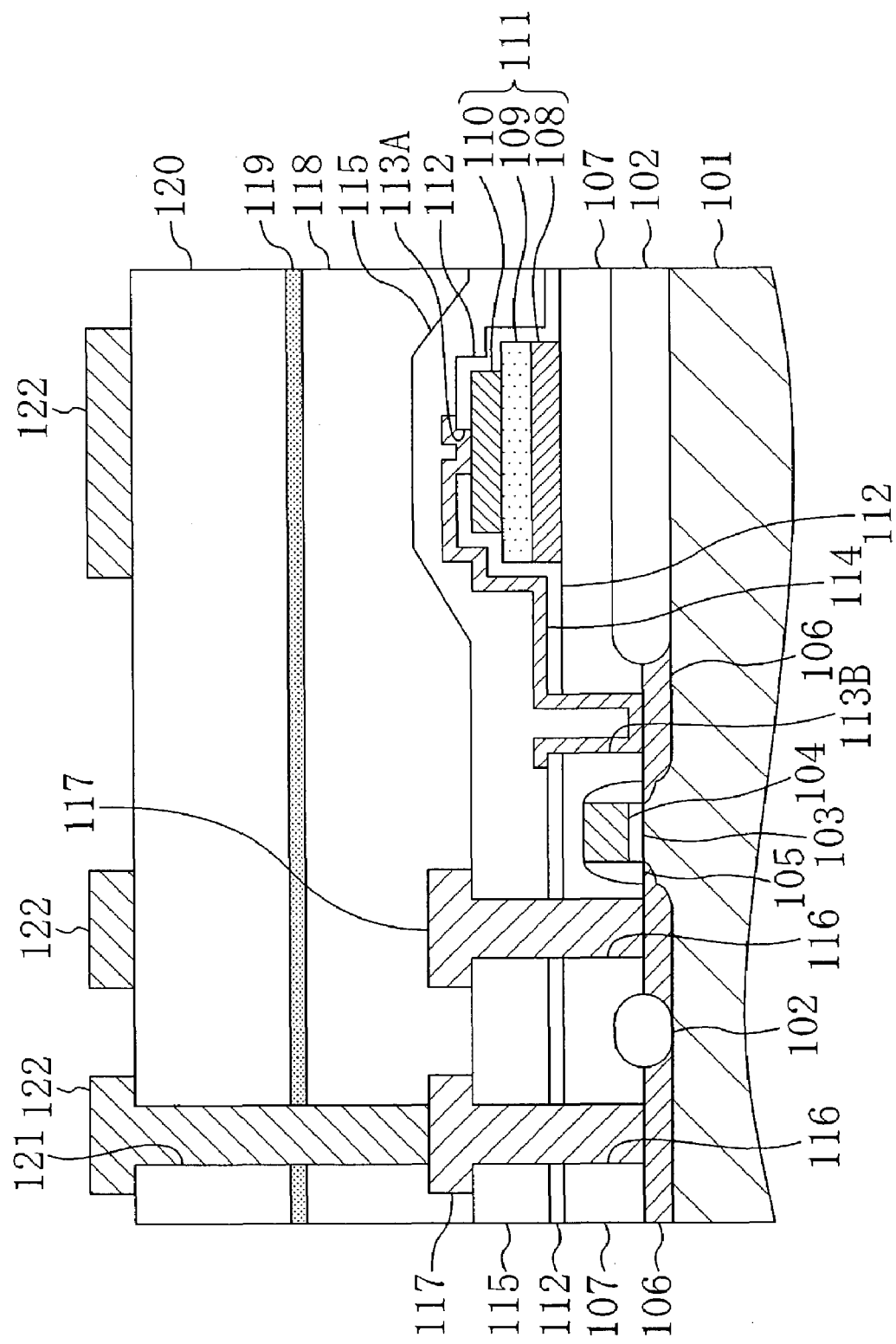
FIG. 10 is a cross-sectional view showing the conventional semiconductor device.
Figure 11A:
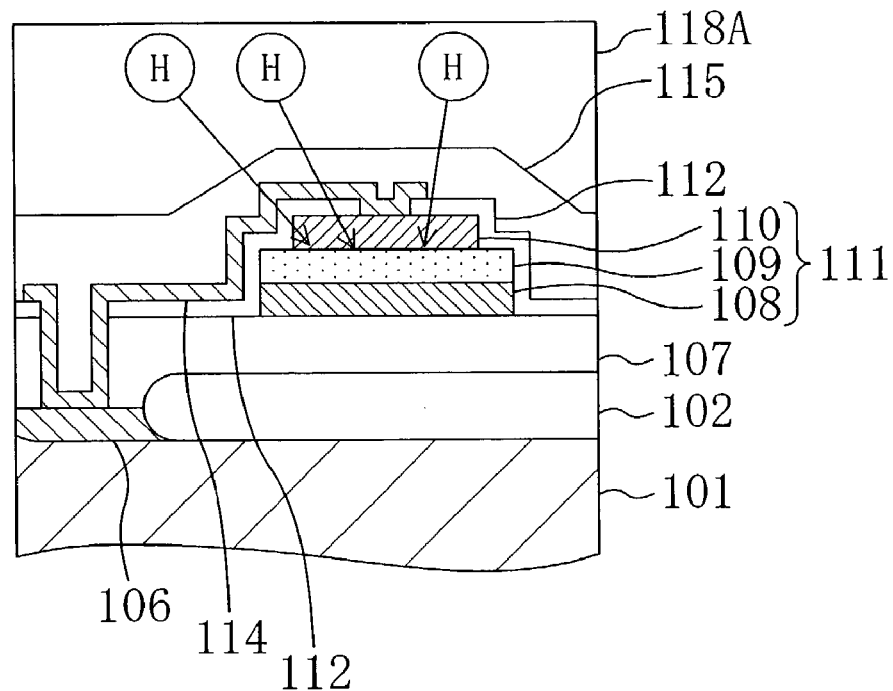
FIG. 11(a) is a view for use in describing a first problem of the conventional semiconductor device and FIG. 11(b) a view for use in describing a second problem of the conventional semiconductor device.
Figure 11B:
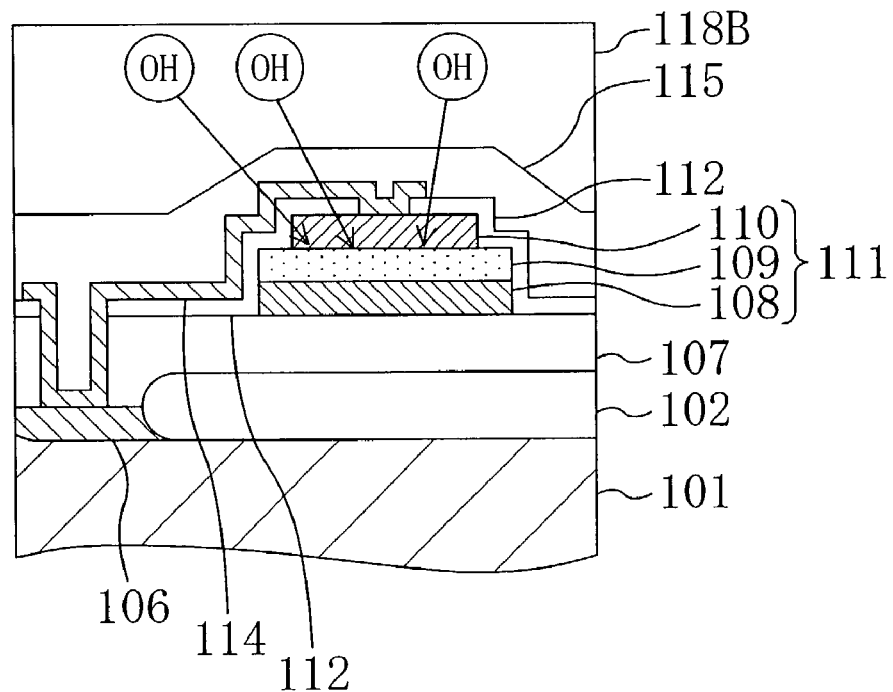

Next, with respect to the semiconductor device of the second embodiment and the conventional semiconductor device shown in FIG. 10, respective capacitor characteristics, more specifically, remanent polarizations in the respective capacitors, were compared, thus obtaining the results shown in FIG. 4, as in the first embodiment. Specifically, in the second embodiment, characteristics of the capacitor 63 are hardly deteriorated after the formation of the first-layer wire 66, and do not vary so widely. This is because, in the second embodiment, a silicon oxide film deposited by a thermal CVD process is also used as the first interlevel dielectric film 67. Thus, the first interlevel dielectric film 67 can be formed without using a plasma, so that no active hydrogen ions or hydrogen radicals is generated during the deposition of the first interlevel dielectric film 67. Also, the deposited first interlevel dielectric film 67 contains a very small amount of moisture. As a result, the reduction of the capacitive insulating film 61 caused by hydrogen or moisture is almost perfectly suppressed.

Also, in the second embodiment, the first interlevel dielectric film 67 has a moisture content lower than that of the second interlevel dielectric film 69. Alternatively, the mass of moisture contained per unit volume of the first interlevel dielectric film 67 may be smaller than that of the second interlevel dielectric film 69.

Further, in the second embodiment, the barrier film 68 prevents hydrogen from diffusing, and the hydrogen content of the first interlevel dielectric film 67 (or the mass of hydrogen contained per unit volume of the first interlevel dielectric film 67) is preferably lower than that of the second interlevel dielectric film 69 (or the mass of hydrogen contained per unit volume of the second interlevel dielectric film 69).

Then, the first interlevel dielectric film 67 contains a small amount of hydrogen (including hydrogen ions or hydrogen radicals generated during the deposition of the first interlevel dielectric film 67), thus suppressing reduction of the capacitive insulating film 61 caused by the hydrogen. In addition, the second interlevel dielectric film 69 is formed over the first interlevel dielectric film 67 with the barrier film 68, which has been formed to overlap the capacitor 63 and prevents hydrogen from diffusing, interposed between the first and second interlevel dielectric films 67 and 69. Thus, hydrogen contained in the second interlevel dielectric film 69 (including hydrogen ions or hydrogen radicals generated during the deposition of the second interlevel dielectric film 69) is prevented from entering the capacitor 63 and from reducing the capacitive insulating film 61. Moreover, the capacitive insulating film 61 is not reduced by hydrogen generated during a fabrication process after the second interlevel dielectric film 69 has been formed. Accordingly, the reduction of the capacitive insulating film 61 is prevented as intended, thus further ensuring improvement of characteristics of the capacitor 63.

In the second embodiment, the silicon oxide film deposited by a thermal CVD process is used as the first interlevel dielectric film 67. However, the present invention is not limited to this specific embodiment and another insulating film with a low moisture content (or the mass of moisture contained per unit volume) may be used alternatively.

Also, in the second embodiment, the silicon oxide film formed by chemical reaction of ozone and TEOS or the SOG film formed by an SOG process is used as the second interlevel dielectric film 69. However, the present invention is not limited to this specific embodiment and another insulating film that can be easily planarized may be used alternatively.

Further, in the second embodiment, the barrier film 68 preferably includes at least one film selected from the group consisting of titanium film, titanium oxide film, tantalum film, tantalum oxide film, alumina film, silicon nitride film, silicon oxynitride film, aluminum titanium nitride film, and alloy film of titanium and aluminum, for example. Then, moisture contained in the second interlevel dielectric film 69 or moisture generated during a fabrication process after the formation of the second interlevel dielectric film 69 does not enter the capacitor 63. As a result, it is ensured that deterioration of characteristics of the capacitor 63 due to reduction of the capacitive insulating film 61 is prevented.

Moreover, in the second embodiment, the capacitive insulating film 61 preferably includes at least one film selected from the group consisting of ferroelectric film having a bismuth-layered perovskite crystal structure (e.g., a $SrBi_2(Ta_{1-z}Nb_z)_2O_9$ film where $0 \leq z \leq 1$), $Pb(Zr_{1-x}Ti_x)O_3$ film (where $0 \leq x \leq 1$), $(Ba_{1-y}Sr_y)TiO_3$ film (where $0 \leq y \leq 1$), $Ta_2O_5$ film, $Al_2O_3$ film and $La_2O_3$ film, for example. Then, it is possible to implement the capacitor 63 using a reliable high-κ material or ferroelectric for its capacitive insulating film 61.

Furthermore, in the second embodiment, the via hole 70, which reaches the first-layer wire 66 and is filled with part of the second-layer wire 71, is preferably provided in respective regions of the first and second interlevel dielectric films 67 and 69 where the barrier film 68 is not formed. Then, even if the barrier film 68 is made of a conductive material, it is possible to prevent the barrier film 68 and a multilevel interconnection from being short-circuited.

Hereinafter, it will be described how the barrier film 68 is disposed in the semiconductor device of the second embodiment with reference to FIGS. 9(a) through 9(c).

Figure 9A:
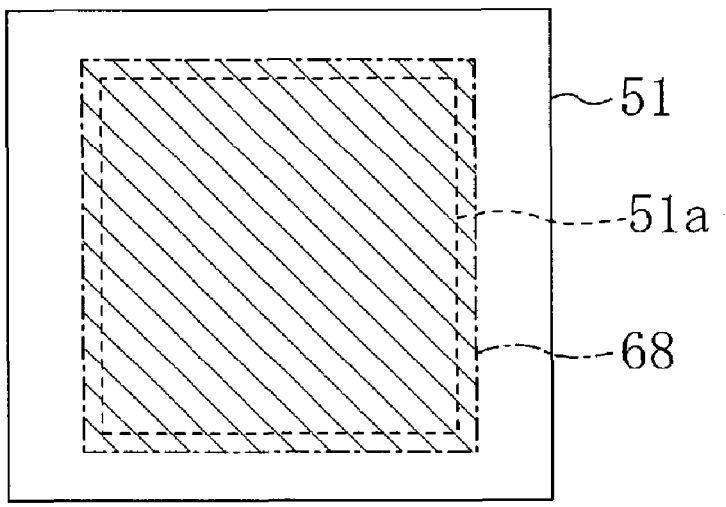
FIGS. 9(a) through 9(c) are views showing how a barrier film is disposed in the semiconductor device of the second embodiment.
Figure 9B:
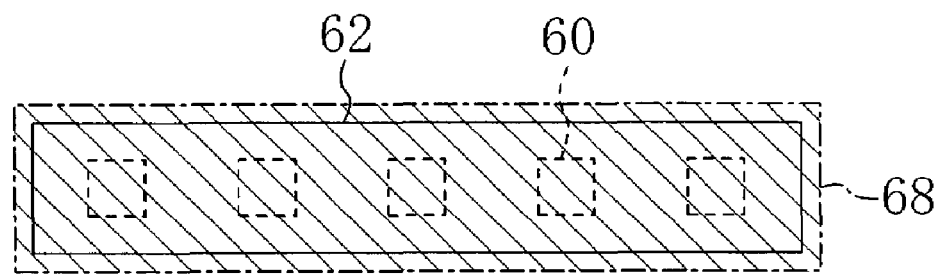
Figure 9C:
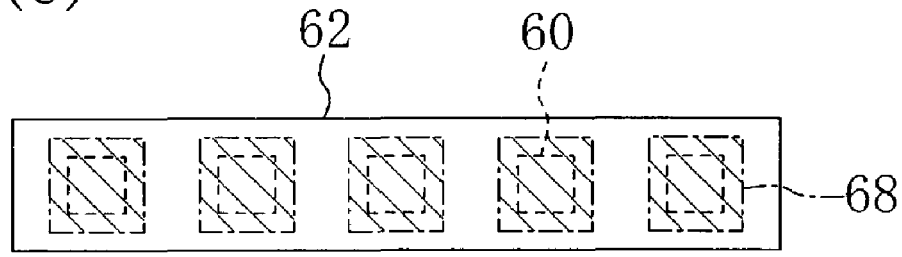

FIGS. 9(a) through 9(c) schematically illustrate the barrier film 68 as viewed from above.

As shown in FIG. 9(a), for example, the barrier film 68 may be disposed to overlap the whole of a region 51a of the semiconductor substrate 51 where a memory cell array is provided. Alternatively, as shown in FIG. 9(b), the barrier film 68 may be disposed to overlap the whole of the upper electrode 62 to be a cell plate for memory cells. Alternatively, as shown in FIG. 9(c), the barrier film 68 may be disposed to overlap each of the lower electrodes 60 to be a storage node of the memory cells. By disposing the barrier film 68 in such a way as shown in any of FIGS. 9(a) through 9(c), it is ensured that moisture is prevented from entering the capacitor 63 during the process step of forming the second interlevel dielectric film 69 or the subsequent fabrication process steps, resulting in improving characteristics of the capacitor 63. It should be noted that the disposition of the barrier film 68 is not limited to the examples shown in FIGS. 9(a) through 9(c) in the second embodiment.

The invention claimed is:

1. A semiconductor device characterized by comprising:
   a capacitor made up of a lower electrode, a capacitive insulating film of an insulating metal oxide and an upper electrode, the lower electrode, the capacitive insulating film and the upper electrode being stacked in that order over a semiconductor substrate;
   a passivation film formed over the semiconductor substrate to cover the capacitor;
   a first-layer wire formed on the passivation film;
   a first interlevel dielectric film formed on the passivation film to cover the first-layer wire and the capacitor;
   a barrier film formed on the first interlevel dielectric film to overlap at least part of the capacitor, for preventing hydrogen from diffusing;
   a second interlevel dielectric film formed over the first interlevel dielectric film and the barrier film;
   a second-layer wire formed on the second interlevel dielectric film; and
   a via hole formed in respective regions of the first and second interlevel dielectric films where the barrier film is not formed, the via hole being formed to reach the first-layer wire,
   wherein the first interlevel dielectric film has a hydrogen content lower than that of the second interlevel dielectric film, and
   wherein the second-layer wire is electrically connected to the first-layer wire by way of the via hole.

2. The semiconductor device of claim 1, characterized in that:
   the barrier film prevents moisture from diffusing; and
   the first interlevel dielectric film has a moisture content lower than that of the second interlevel dielectric film.

3. The semiconductor device of claim 1, characterized in that the barrier film includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

4. The semiconductor device of claim 1, characterized in that the capacitive insulating film includes at least one film selected from the group consisting of: a ferroelectric film having a bismuth-layered perovskite crystal structure; a $Pb(Zr_{1-x}Ti_x)O_3$ film (where $0 \leq x \leq 1$) a $(Ba_{1-y}Sr_y)TiO_3$ film (where $0 \leq y \leq 1$); a $Ta_2O_5$ film; an $Al_2O_3$ film; and an $La_2O_3$ film.

5. The semiconductor device of claim 1, characterized by including:
   a transistor formed on the semiconductor substrate and constituting a memory cell array with the capacitor,
   wherein the barrier film is formed to overlap the whole of a region where the memory cell array is provided.

6. The semiconductor device of claim 5, characterized in that:
   the capacitor is provided over the semiconductor substrate including the transistor, with an insulating film interposed between the capacitor and the semiconductor substrate; and
   the first-layer wire electrically connects the capacitor and the transistor by way of first and second contact holes, the first contact hole being formed in the passivation film to reach the upper electrode, the second contact hole being formed in the passivation film and the insulating film to reach the transistor.

7. The semiconductor device of claim 5, characterized in that:

the capacitor is provided over the semiconductor substrate including the transistor, with an insulating film interposed between the capacitor and the semiconductor substrate; and the insulating film is provided with a plug that connects the lower electrode and the transistor, thereby electrically connecting the capacitor and the transistor.

8. The semiconductor device of claim 1, characterized in that:

the barrier film is formed to overlap either one of the lower and upper electrodes.

9. The semiconductor device of claim 1, characterized in that:

the first interlevel dielectric film is a silicon oxide film deposited by a thermal CVD process.

10. The semiconductor device of claim 1, characterized in that:

the second interlevel dielectric film includes at least one film selected from the group consisting of a silicon oxide film deposited by a plasma-enhanced CVD process and a silicon oxyfluoride film deposited by a plasma-enhanced CVD process.

11. A semiconductor device characterized by comprising:

a capacitor made up of a lower electrode, a capacitive insulating film of an insulating metal oxide and an upper electrode, the lower electrode, the capacitive insulating film and the upper electrode being stacked in that order over a semiconductor substrate;

a passivation film formed over the semiconductor substrate to cover the capacitor;

a first-layer wire formed on the passivation film;

a first interlevel dielectric film formed on the passivation film to cover the first-layer wire and the capacitor;

a barrier film formed on the first interlevel dielectric film to overlap at least part of the capacitor, for preventing moisture from diffusing;

a second interlevel dielectric film formed over the first interlevel dielectric film and the barrier film;

a second-layer wire formed on the second interlevel dielectric film; and a via hole formed in respective regions of the first and second interlevel dielectric films where the barrier film is not formed, the via hole being formed to reach the first-layer wire, wherein the first interlevel dielectric film has a moisture content lower than that of the second interlevel dielectric film; and wherein the second-layer wire is electrically connected to the first-layer wire by way of the via hole.

12. The semiconductor device of claim 11 characterized in that the barrier film includes at least one film selected from the group consisting of: a titanium film; a titanium oxide film; a tantalum film; a tantalum oxide film; an alumina film; a silicon nitride film; a silicon oxynitride film; an aluminum titanium nitride film; and an alloy film of titanium and aluminum.

13. The semiconductor device of claim 11 characterized in that the capacitive insulating film includes at least one film selected from the group consisting of: a ferroelectric film having a bismuth-layered perovskite crystal structure; a Pb$(Zr_{1-x}Ti_x)O_3$ film (where $0 \leq x \leq 1$); a $(Ba_{1-y}Sr_y)TiO_3$ film (where $0 \leq y \leq 1$); a $Ta_2O_5$ film; an $Al_2O_3$ film; and an $La_2O_3$ film.

14. The semiconductor device of claim 11 characterized by including:

a transistor formed on the semiconductor substrate and constituting a memory cell array with the capacitor, wherein the barrier film is formed to overlap the whole of a region where the memory cell array is provided.

15. The semiconductor device of claim 14 characterized in that:

the capacitor is provided over the semiconductor substrate including the transistor, with an insulating film interposed between the capacitor and the semiconductor substrate; and the first-layer wire electrically connects the capacitor and the transistor by way of first and second contact holes, the first contact hole being formed in the passivation film to reach the upper electrode, the second contact hole being formed in the passivation film and the insulating film to reach the transistor.

16. The semiconductor device of claim 14 characterized in that:

the capacitor is provided over the semiconductor substrate including the transistor, with an insulating film interposed between the capacitor and the semiconductor substrate; and the insulating film is provided with a plug that connects the lower electrode and the transistor, thereby electrically connecting the capacitor and the transistor.

17. The semiconductor device of claim 11 characterized in that:

the barrier film is formed to overlap either one of the lower and upper electrodes.

18. The semiconductor device of claim 11 characterized in that:

the first interlevel dielectric film is a silicon oxide film deposited by a thermal CVD process.

19. The semiconductor device of claim 11 characterized in that:

the second interlevel dielectric film includes at least one film selected from the group consisting of a silicon oxide film formed by reaction of ozone and TEOS and SOG film.

* * * * *